United States Patent
Takeda et al.

(10) Patent No.: US 6,994,945 B2
(45) Date of Patent: *Feb. 7, 2006

(54) SILICON-CONTAINING POLYMER, RESIST COMPOSITION AND PATTERNING PROCESS

(75) Inventors: Takanobu Takeda, Nakakubiki-gun (JP); Jun Hatakeyama, Nakakubiki-gun (JP); Toshinobu Ishihara, Nakakubiki-gun (JP); Tohru Kubota, Nakakubiki-gun (JP); Yasufumi Kubota, Nakakubiki-gun (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 247 days.

This patent is subject to a terminal disclaimer.

(21) Appl. No.: 10/085,935

(22) Filed: Mar. 1, 2002

(65) Prior Publication Data

US 2002/0168581 A1 Nov. 14, 2002

(30) Foreign Application Priority Data

Mar. 1, 2001 (JP) .................................. 2001-056543

(51) Int. Cl.
- *G03C 1/73* (2006.01)
- *G03F 7/039* (2006.01)
- *G03F 7/30* (2006.01)
- *G03F 7/36* (2006.01)
- *C08F 30/08* (2006.01)

(52) U.S. Cl. ............... 430/270.1; 430/326; 430/327; 430/328; 430/330; 430/331; 430/313; 430/317; 430/905; 430/907; 430/910; 430/914; 526/279

(58) Field of Classification Search ............... 526/279; 430/270.1, 905, 907, 910, 914, 313, 317, 430/326, 327, 328, 331, 330
See application file for complete search history.

(56) References Cited

U.S. PATENT DOCUMENTS

| 3,969,543 A | 7/1976 | Roberts et al. |
| 4,491,628 A | 1/1985 | Ito et al. |

(Continued)

FOREIGN PATENT DOCUMENTS

| DE | 272 141 A | 9/1989 |
| JP | 61105542 | * 5/1986 |

(Continued)

OTHER PUBLICATIONS

Butler et al (Chem. Abstract for "Copolymerization of Trimethylvinylsilane and Dimethyldivinylsilane with Maleic Anhydride", Journal of Polymer Science, Polymer Chemistry Edition, vol. 8(2) (1970), p. 523–32).*

(Continued)

*Primary Examiner*—Sin Lee
(74) *Attorney, Agent, or Firm*—Millen, White, Zelano & Branigan P.C.

(57) ABSTRACT

Novel silicon-containing polymers are obtained by copolymerizing a vinylsilane monomer with a compound having a low electron density unsaturated bond such as maleic anhydride, maleimide derivatives or tetrafluoroethylene. Using the polymers, chemical amplification positive resist compositions sensitive to high-energy radiation and having a high sensitivity and resolution at a wavelength of less than 300 nm and improved resistance to oxygen plasma etching are obtained.

37 Claims, 2 Drawing Sheets

U.S. PATENT DOCUMENTS

| | | | | |
|---|---|---|---|---|
| 5,164,286 | A | * 11/1992 | Blakeney et al. | 430/331 |
| 5,310,619 | A | 5/1994 | Crivello et al. | |
| 5,776,657 | A | * 7/1998 | Schaedeli et al. | 430/281.1 |
| 5,843,624 | A | * 12/1998 | Houlihan et al. | 430/296 |
| 5,880,169 | A | * 3/1999 | Osawa et al. | 522/25 |
| 6,022,672 | A | * 2/2000 | Ikeda | 430/325 |
| 6,048,661 | A | * 4/2000 | Nishi et al. | 430/270.1 |
| 6,162,565 | A | * 12/2000 | Chao et al. | 430/5 |
| 6,589,705 | B1 | * 7/2003 | Sato et al. | 430/270.1 |
| 2002/0042485 | A1 | * 4/2002 | Fang et al. | 526/279 |

FOREIGN PATENT DOCUMENTS

| | | | |
|---|---|---|---|
| JP | 63027829 A | | 2/1988 |
| JP | 01101312 | * | 4/1989 |
| JP | 90027660 B | | 6/1990 |
| JP | 07036188 | * | 2/1995 |
| JP | 09073173 A | | 3/1997 |
| JP | 09110938 A | | 4/1997 |
| JP | 09230595 A | | 9/1997 |
| JP | 10010739 A | | 1/1998 |
| JP | 10324748 A | | 12/1998 |
| JP | 11302382 A | | 11/1999 |
| JP | 2000-313725 | * | 11/2000 |
| SU | 767 140 A | | 9/1980 |
| WO | WO 97/33198 | | 9/1997 |

OTHER PUBLICATIONS

Khananashvili et al (Chem. Abstract for("Synthesis of 1–vinyl–1,5,5–trimethyl–3,3,7,7–tetraphenylcyclotetrasiloxane and Polymer) Based on it", Izvestiya Akademii Nauk Gruzii, Seriya Khimicheskaya, vol. 17(1) (1991), p. 23–26).*

Sutyagin et al (Chem. Abstract for "Thermal and Radiation-Induced Degradation of Polysiloxane Layers Produced by an Electron–Beam Method", Khimiya Vyoskikh Energii, vol. 11(5) (1977), p. 308–12).*

Kaufman et al (Chem. Abstract for "Polyorganosiloxanes Containing Methylvinylsiloxane Links", U.S.S.R. SU 504804 1976022 from: Otkrytiya, Izobret., Prom. Obraztsy, Tovarnye Znaki, vol. 53(8) (1976), p. 63).*

Chiang et al ("A Novel Silicon–Containing Copolymer for a Resist Highly Etching–Resistant to Oxygen Plasma", Angewandte Makromolekulare Chemie, vol. 209 (1993), p. 25–32, and its Chem. Abstract).*

Derwent English abstract for JP 07036188 (Kodachi et al).*

Chem. Abstract for JP 61105542 (Tanaka et al).*

Chem. Abstract for JP 01101312 (Saigo).*

Kong et al ("Preparation of Polyacrylate–Polysiloxane Core–Shell Latex Partciles",(Polymers for Advanced Technologies,) vol. 7(12) (1996), p. 888–890, and its Chem. Abstract.*

Chem. Abstract (AN 1981:31895)—English abstract for SU 767140 (Zhdanov et al).*

Chemical Abstract 2000 : 803821—English abstract for JP 2000–313725, 2000.*

Machine—Assisted English Translation for JP 2000–313725 provided by Japan Patent Office, 2000.*

International Work Shop 157nm Lithography MIT–LL, Boston, MA, May 5, 1999.

Kunz et al. "Outlook for 157 nm Resist Design," *J. Vac. Sci. Technol.* B 17(6), Nov./Dec. 1999, pp. 3267–3272.

Chiba et al., "157 nm Resist Materials: A Progress Report," *J. Photopolymer Science and Technology*, vol. 13, No. 4 (2000) pp 657–664.

Schmaljohann et al., "Fundamental Studies of Fluoropolymer Photoresists for 157 nm Lithography," *J. of Photopolymer Science Technology*, vol., 13, No. 3 (2000) pp 451–458.

Brunsvold et al., "Evaluation of a Deep UV Bilayer Resist for Sub–Half Micron Lithography," *SPIE vol. 1925* (1993), pp. 377–387.

Hatakeyama et al., "Investigation of Discrimination Enhancement in Polysilsesquioxane Based Positive Resist for ArF Lithography" SPIE vol. 3333, pp. 62–72.

Blakeney et al., "Evaluation of Materials for 193–nm Lithography" J of Photopolymer Science and Technology, vol. 9, No. 3 (1996) pp 435–446.

Kessel, et al., "novel Silicon–Containing Resists for EUV and 193 nm Lithography" SPIE vol. 3678 (1999), pp: 214–220.

Lin et al., "A High Resolution 248 nm Bilayer Resist" SPIE vol. 3678 (1999) pp. 241250.

Boardman et al., "Chemical Aspects of Silicon–Containing Bilayer Resists" SPIE vol. 3678 (1999) pp. 562–572.

Kim et al., "Chemically amplified resist based on the methacrylate polymer with 2–trimethylsilyl–2–propyl ester protecting group" SPIE vol. 3678 (1999) pp 420–428.

Antoni S. Gozdz et al., "Application of Poly (Alkenylsilane Sulfone)s as Positive Electron Beam Resists for Two–Layer System", Photopolymers: Principles, Processes and Materials, 1985, pp. 157–165.

R. Sezi et al., "Positive Near–UV Resist for Bilayer Lithography", Optical Microlithographic Technology for Integrated Circuit Fabrication and Inspection, The Hague, vol. 811, 1987, pp. 172–179.

Zhdanov, A. A. et al: "Interaction of diethyl phosphate and diethylphosphino oxide with vinyl–containing organocyclosiloxanes" retrieved from STN Database accession No. 98:126923 XP002266535 abstract * & Vysokomolekulyarnye Soedineniya, Seriya A (1983), 25(2), 360–4, Abstract.

* cited by examiner

SILICON-CONTAINING POLYMER, RESIST COMPOSITION AND PATTERNING PROCESS

This invention relates to silicon-containing polymers suitable as the base resin in resist compositions, especially chemically amplified positive resist compositions used for micropatterning in a process for the fabrication of semiconductor devices. It also relates to resist compositions, especially chemically amplified positive resist compositions adapted for exposure to high-energy radiation such as deep-UV, KrF excimer laser light (248 nm), ArF excimer laser light (193 nm), $F_2$ laser light (157 nm), electron beams or x-rays, and a process for forming a pattern.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. In particular, the change-over from i-line (365 nm) to shorter wavelength KrF excimer laser (248 nm) brought about a significant innovation, enabling mass-scale production of 0.18 micron rule devices. To the demand for a resist material with a higher resolution and sensitivity, acid-catalyzed chemical amplification positive working resist materials are effective as disclosed in U.S. Pat. No. 4,491,628 and U.S. Pat. No. 5,310,619 (JP-B 2-27660 and JP-A 63-27829). They now become predominant resist materials especially adapted for deep UV lithography.

Resist materials adapted for KrF excimer lasers enjoyed early use on the 0.3 micron process, went through the 0.25 micron rule, and currently entered the mass production phase on the 0.18 micron rule. Engineers have started investigation on the 0.15 micron rule, with the trend toward a finer pattern rule being accelerated. A wavelength change-over from KrF to shorter wavelength ArF excimer laser (193 nm) is expected to enable miniaturization of the design rule to 0.13 $\mu$m or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

With respect to $F_2$ laser light (157 nm) which is expected to enable further miniaturization to 0.10 $\mu$m or less, more difficulty arises in insuring transparency because it was found that acrylic resins are not transmissive to light at all and those cycloolefin resins having carbonyl bonds have strong absorption. Polymers having benzene rings have a somewhat improved transmittance in proximity to 160 nm wavelength, which is far below the practically acceptable level. It was found that in single layer resists, reducing carbon-to-carbon double bonds as typified by benzene rings and carbon-to-carbon double bonds as typified by benzene rings and carbon-to-oxygen double bonds as typified by carbonyl groups is essential for insuring a light transmittance (see International Work Shop 157 nm Lithography MIT-LL, Boston, Mass., May 5, 1999). It was reported in J. Vac. Sci. Technol., B17(6), November/December 1999 that introduction of fluorine is effective to improve transmittance. A number of fluorinated polymers for resist compositions were proposed in J. Photopolymer Sci. and Technol., Vol. 13, No. 4 (2000), pp. 657–664 and pp. 451–458. However, the transmittance of these polymers does not reach that of polyhydroxystyrene and derivatives thereof adapted for KrF exposure and poly(meth)acrylic derivatives and polycycloolefin derivatives adapted for ArF exposure.

As is known in the art, the two-layer resist method is advantageous in forming a high-aspect ratio pattern on a stepped substrate. It is also known that in order that a two-layer resist film be developable with a common alkaline developer, high molecular weight silicone compounds having hydrophilic groups such as hydroxyl and carboxyl groups must be used.

Among silicone base chemically amplified positive resist compositions, recently proposed were those compositions for KrF exposure comprising a base resin in the form of polyhydroxybenzylsilsesquioxane, which is a stable alkali-soluble silicone polymer, in which some phenolic hydroxyl groups are blocked with t-BOC groups, in combination with a photoacid generator (see SPIE vol. 1925 (1993), p. 377). Positive resist compositions comprising as a base a silsesquioxane of the type in which cyclohexyl-carboxylic acid is substituted with an acid labile group were proposed for ArF exposure (see JP-A 10-324748, JP-A 11-302382, and SPIE vol. 3333-07 (1998), p. 62). Also proposed were silicone-containing polymers prepared from silicon-containing acrylic monomers (see JP-A 9-110938, J. Photopolymer Sci. and Technol., Vol. 9, No. 3 (1996), pp. 435–446).

The silicon-containing polymer of the acrylic pendant type has the drawback that its resistance to dry etching with oxygen plasma is weak as compared with the silsesquioxane polymer. A low silicon content and a different polymer main skeleton account for this weak dry etching resistance. The siloxane pendant type polymer has the other drawback of poor developer wetting that it is likely to repel a developer solution. SPIE vol. 3678, pp. 214, 241 and 562 describes a polymer comprising recurring units of the trisilane or tetrasilane pendant type having an increased silicon content and a silicon-containing substituent which can be eliminated with acid. However, since di- and polysilane compounds exhibit strong absorption at a wavelength of less than 200 nm, an increased introduction of such silanes undesirably leads to a lower transmittance. Besides, an attempt of introducing silicon into acid labile groups is reported in SPIE vol. 3678, p. 420. Because of a low acid elimination ability, there are drawbacks including low environmental stability and a T-top profile.

The applicant/assignee proposed in U.S. Ser. No. 09/726, 592 or Japanese Patent Application No. 11-342380, an acid labile group in the form of a cyclic hydrocarbon group having silicon introduced therein. This polymer has the advantages of an improved acid elimination ability and prevention of T-top profiling and allows dry etching resistance to be enhanced by introducing two or more silicon atoms in a single cyclic hydrocarbon group. The presence of a carbon atom between silicon atoms shirks formation of a disilane bond and eliminates a concern about a loss of transmittance to ArF exposure.

However, the most serious drawback of acrylic pendant type silicon-containing polymers is a low glass transition temperature (Tg). Since chemically amplified resist compositions are designed such that elimination reaction of acid labile groups is induced by post-exposure baking (PEB), the polymer should have a Tg equal to or above the baking temperature. The PEB temperature is usually 80 to 150° C., and a Tg of about 150° C. is necessary. If PEB is performed above the Tg of the polymer, the acid diffuses through the thermally flowing polymer, losing control on pattern dimensions after development.

Another drawback of acrylic pendant type silicon-containing polymers is that when observed under a dimension measurement SEM, line dimensions are reduced during measurement. This is because ester groups are cleaved by irradiation of electron beams and the resulting ester end moieties volatilize off. A further drawback is slimming of a resist film upon exposure to a $F_2$ laser. This is also because volume shrinkage occurs as a result of ester groups being cleaved by irradiation of VUV laser beams. When a polymer having silicone-pendant ester groups is irradiated with VUV laser beams, silicone compounds can volatilize out of the polymer. The volatilized silicone compounds will deposit on the surface of a projection lens, leading to a transmittance decline. It is reported that deposits of silicone compounds are difficult to remove as compared with hydrocarbon deposits.

SUMMARY OF THE INVENTION

An object of the invention is to provide a novel silicon-containing polymer which is useful as the base polymer in a resist composition, especially a chemically amplified positive resist composition, having a high sensitivity and high resolution, especially suitable as a material for use in the two-layer resist method adapted to form a high-aspect ratio pattern, and capable of forming a pattern having improved heat resistance. Another object of the invention is to provide a resist composition, especially a chemically amplified positive resist composition, comprising the polymer as the base resin, and a method for forming a resist pattern using the same.

Making a study on silicon-containing polymers other than the acrylic pendant type, we have found that a vinylsilane or similar monomer having silicone pendant from its unsaturated bond, which has heretofore been unable to radically polymerize alone or copolymerize with norbornene and acrylic monomers, can be copolymerized with a compound having a low electron density unsaturated bond as typified by maleic anhydride, maleimide derivatives and tetrafluoroethylene. Presuming that oxygen etching resistance will be enhanced by converting vinylsilane to an unsaturated bond-bearing silicone monomer having at least two silicon atoms, we have arrived at the discovery that oxygen etching resistance is enhanced using a cyclic or box-shaped silicone.

In a first aspect, the invention provides a silicon-containing polymer comprising recurring units of the following general formula (1) and/or (2).

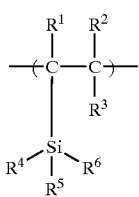
(1)

Herein $R^1$, $R^2$ and $R^3$ each are hydrogen or a straight, branched or cyclic alkyl group of 1 to 10 carbon atoms, $R^4$, $R^5$ and $R^6$ each are independently an alkyl or haloalkyl group having 1 to 20 carbon atoms, an aryl group having 6 to 20 carbon atoms or a silicon-containing group attached to the silicon atom through a siloxane or silalkylene linkage.

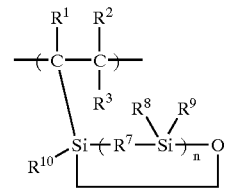
(2)

Herein $R^1$ to $R^3$ are as defined above, $R^7$ is an oxygen atom, a straight, branched or cyclic alkylene group of 1 to 10 carbon atoms or an arylene group, $R^8$ to $R^{10}$ each are independently a straight, branched or cyclic alkyl or fluorinated alkyl group having 1 to 10 carbon atoms or an aryl group, and n is an integer of 2 to 10.

The silicon-containing polymer may further include recurring units of the general formula (3).

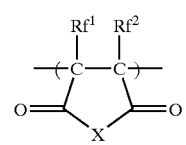
(3)

Herein X is an oxygen atom, a sulfur atom or —NR—, R is hydrogen, hydroxyl, a straight, branched or cyclic alkyl group of 1 to 10 carbon atoms, or an aryl group, and may contain an acid labile group, $Rf^1$ and $Rf^2$ each are independently hydrogen, fluorine or trifluoromethyl.

The silicon-containing polymer may further include recurring units of the general formula (4).

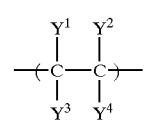
(4)

Herein $Y^1$, $Y^2$, $Y^3$ and $Y^4$ are independently selected from the class consisting of hydrogen, fluorine, chlorine, bromine, cyano, alkoxycarbonyl, fluorinated alkyl and fluorinated alkoxycarbonyl groups.

The silicon-containing polymer may further include recurring units of the general formula (5).

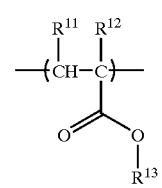
(5)

Herein $R^{11}$ and $R^{12}$ each are hydrogen or a straight, branched or cyclic alkyl group of 1 to 10 carbon atoms, and $R^{13}$ is an acid labile group or adhesive group.

In a second aspect, the invention provides a resist composition comprising the polymer defined above, and especially a chemically amplified, positive resist composition comprising (A) the polymer defined above, (B) a photoacid generator, (C) an organic solvent, and optionally, (D) a dissolution inhibitor and/or (E) a basic compound.

In a third aspect, the invention provides a process for forming a resist pattern comprising the steps of applying the resist composition onto a substrate to form a coating; heat treating the coating and then exposing it to high-energy radiation having a wavelength of up to 300 nm or electron beam through a photo mask; and optionally heat treating the exposed coating and developing it with a developer.

In a fourth aspect, the invention provides a process for forming a resist pattern comprising the steps of:

applying the resist composition onto a processable substrate formed on a support substrate through an organic film to form a resist layer, heat treating the resist layer and then exposing it to high-energy radiation having a wavelength of up to 300 nm or electron beam through a photo mask, optionally heat treating the exposed resist layer and developing it with a developer, and treating the organic film and the processable substrate by an etching process including oxygen plasma etching at the portions where the exposed resist layer portions are removed by developing.

In a fifth aspect, the invention provides a process for forming a resist pattern comprising the steps of:

applying the resist composition onto a processable substrate formed on a support substrate to form a resist layer, heat treating the resist layer and then exposing it to high-energy radiation having a wavelength of up to 300 nm or electron beam through a photo mask, optionally heat treating the exposed resist layer and developing it with a developer, and treating the processable substrate by an etching with a halogen gas containing chlorine or bromine at the portions where the exposed resist layer portions are removed by developing.

DESCRIPTION OF THE PREFERRED EMBODIMENT

Polymer

Figure 1A:
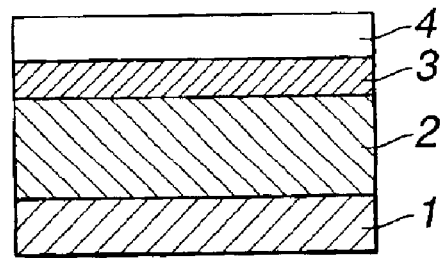
FIG. 1 schematically illustrates a layer structure patterning process involving oxygen etching.

The silicon-containing polymer or high molecular weight compound of the invention is comprised of recurring units of the following general formula (1) and/or (2).

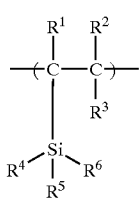

(1)

Herein each of $R^1$, $R^2$ and $R^3$ is hydrogen or a straight, branched or cyclic alkyl group of 1 to 10 carbon atoms, especially 1 to 5 carbon atoms. Each of $R^4$, $R^5$ and $R^6$, which may be the same or different, is an alkyl or haloalkyl group having 1 to 20 carbon atoms, an aryl group having 6 to 20 carbon atoms, especially 6 to 12 carbon atoms, or a silicon-containing group attached to the silicon atom through a siloxane or silalkylene linkage.

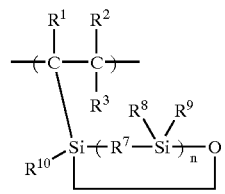

(2)

Herein $R^1$ to $R^3$ are as defined above. $R^7$ is an oxygen atom, a straight, branched or cyclic alkylene group of 1 to 10 carbon atoms, especially 1 to 5 carbon atoms, or an arylene group of 6 to 20 carbon atoms, especially 6 to 12 carbon atoms. Each of $R^8$ to $R^{10}$, which may be the same or different, is a straight, branched or cyclic alkyl or fluorinated alkyl group having 1 to 10 carbon atoms, especially 1 to 5 carbon atoms or an aryl group of 6 to 20 carbon atoms, especially 6 to 12 carbon atoms. The letter n is an integer of 2 to 10, especially 2 to 8.

Examples of suitable straight, branched or cyclic alkyl groups include methyl, ethyl, propyl, isopropyl, n-butyl, isobutyl, tert-butyl, pentyl, cyclopentyl, hexyl, cyclohexyl, octyl, decyl, and dodecyl. Suitable haloalkyl groups are the foregoing alkyl groups in which some or all of the hydrogen atoms are replaced by halogen atoms such as fluorine and chlorine atoms. Of these, suitable fluorinated alkyl groups are the foregoing alkyl groups in which some or all of the hydrogen atoms are replaced by fluorine atoms, for example, trifluoromethyl, 2,2,2-trifluoroethyl, 3,3,3-trifluoropropyl and 1,1,2,2,3,3,3-heptafluoropropyl. Examples of suitable aryl groups include phenyl, xylyl, tolyl and naphthyl. Suitable alkylene and arylene groups correspond to the foregoing alkyl and aryl groups, respectively, with one hydrogen atom attached to a carbon atom being eliminated.

The silicon-containing group attached to the silicon atom through a siloxane or silalkylene linkage is exemplified by the following formula.

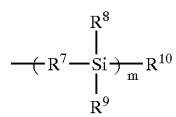

Herein $R^7$ to $R^{10}$ are as defined above, and m is an integer of 1 to 10, especially 1 to 6.

Examples of the silicon-containing recurring units of formula (1) are units of the formulae (1)-1 to (1)-8 below.

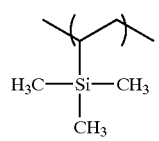

(1)-1

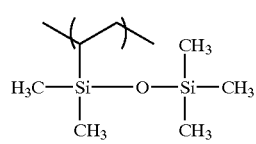

(1)-2

-continued (1)-3
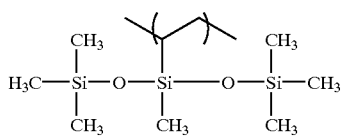

(1)-4
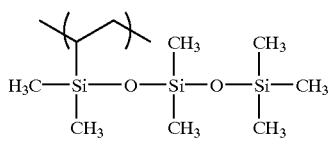

(1)-5
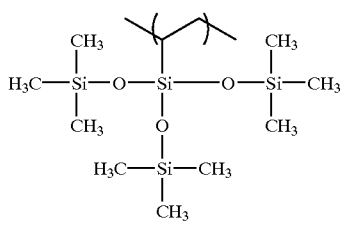

(1)-6
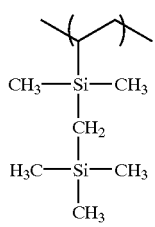

(1)-7
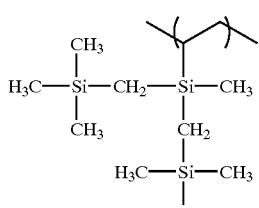

(1)-8
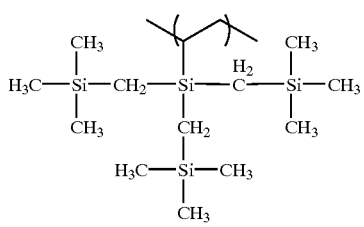

Examples of the silicon-containing recurring units of formula (2) are units of the formulae (2)-1 to (2)-4 below.

(2)-1
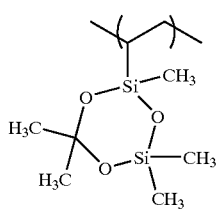

(2)-2
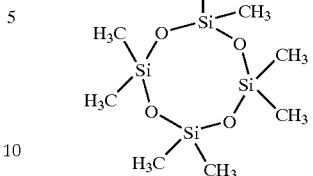

(2)-3
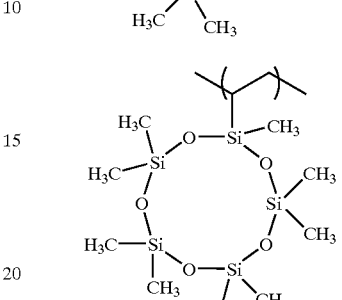

(2)-4
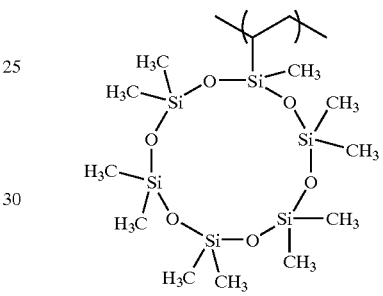

In addition to the units (1) and (2), the silicon-containing polymer of the invention may contain recurring units of the formula (3) below.

(3)
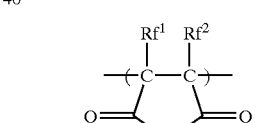

Herein X is an oxygen atom, a sulfur atom or —NR—. R is hydrogen, hydroxyl, a straight, branched or cyclic alkyl group of 1 to 10 carbon atoms, especially 1 to 6 carbon atoms, or an aryl group of 6 to 20 carbon atoms, especially 6 to 10 carbon atoms. R may be a group containing an acid labile group, for example, an alkoxycarbonylalkyl group having 3 to 12 carbon atoms. Each of $Rf^1$ and $Rf^2$, which may be the same or different, is hydrogen, fluorine or trifluoromethyl.

Examples of the alkyl group represented by R are the same as exemplified above. The alkoxycarbonylalkyl group of R is represented by the formula: —R'—COO—R" wherein R' is an alkylene group having 1 to 3 carbon atoms and R" is a straight, branched or cyclic alkyl group having 1 to 10 carbon atoms, especially 1 to 7 carbon atoms.

Examples of the recurring units of formula (3) are units of the formulae (3)-1 to (3)-11 below.

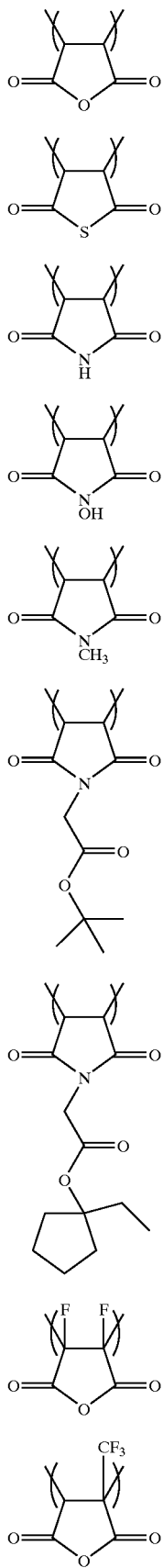

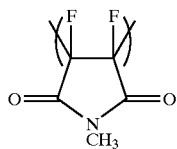

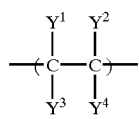

The silicon-containing polymer of the invention may further contain recurring units of the formula (4) below.

$$\begin{array}{c} Y^1 \;\; Y^2 \\ -(\!C\!-\!C\!)\!- \\ Y^3 \;\; Y^4 \end{array} \quad (4)$$

Herein each of $Y^1$, $Y^2$, $Y^3$ and $Y^4$, which may be the same or different, is selected from among hydrogen, fluorine, chlorine, bromine, cyano, alkoxycarbonyl, fluorinated alkyl and fluorinated alkoxycarbonyl groups.

The alkoxycarbonyl groups represented by $Y^1$ to $Y^4$ are usually such groups of 2 to 12 carbon atoms, represented by the formula: —COO—R" wherein R" is as defined above. The fluorinated alkyl groups are usually groups of 1 to 10 carbon atoms, especially 1 to 7 carbon atoms, examples of which are as exemplified above. The fluorinated alkyl ester groups are usually groups of 1 to 10 carbon atoms, especially 1 to 7 carbon atoms, for example, trifluoroethyl, 2,2,3,3-tetrafluoropropyl and 2,2,3,4,4,4-hexafluorobutyl.

Examples of the recurring units of formula (4) are units of the formulae (4)-1 to (4)-10 below.

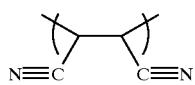

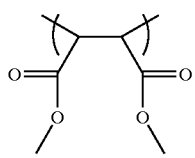

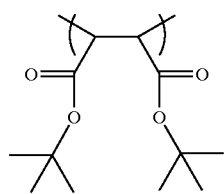

-continued (4)-4
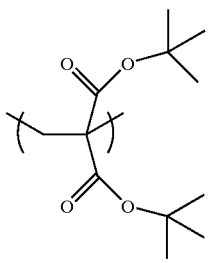

(4)-5
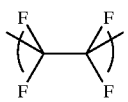

(4)-6
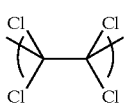

(4)-7
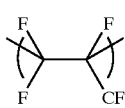

(4)-8
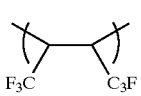

(4)-9
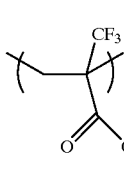

(4)-10

In addition to the above-described units, the silicon-containing polymer of the invention may further contain recurring units of the formula (5) below.

(5)
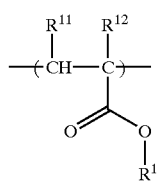

Herein each of $R^{11}$ and $R^{12}$ is hydrogen or a straight, branched or cyclic alkyl group of 1 to 10 carbon atoms, and $R^{13}$ is an acid labile group or adhesive group.

In formula (5), the groups of $R^{11}$ and $R^{12}$ are as exemplified for $R^1$ and $R^2$.

The acid labile group represented by $R^{13}$ is selected from a variety of such groups, preferably tertiary alkyl groups, and especially groups of the general formulae (6) and (7) below.

(6)
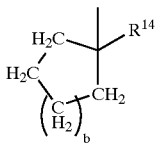

Herein, $R^{14}$ is a methyl, ethyl, isopropyl, cyclohexyl, cyclopentyl, vinyl, acetyl, phenyl, benzyl or cyano group. Letter b is an integer of 0 to 3.

The cyclic alkyl groups of formula (6) are preferably 5-membered rings. Examples include 1-methylcyclopentyl, 1-ethylcyclopentyl, 1-isopropylcyclopentyl, 1-vinylcyclopentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexyl, and 1-cyanocyclohexyl.

(7)
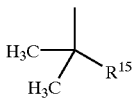

Herein, $R^{15}$ is a methyl, ethyl, isopropyl, cyclohexyl, cyclopentyl, vinyl, phenyl, benzyl or cyano group.

Examples of the group of formula (7) include t-butyl, 1-vinyldimethyl, 1-benzyldimethyl, 1-phenyldimethyl and 1-cyanodimethyl.

Of the recurring units of formula (5) wherein $R^{13}$ is an acid labile group, tertiary ester units of the formulae (5)-1 to (5)-4 below are also preferable.

(5)-1
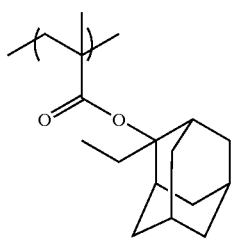

(5)-2
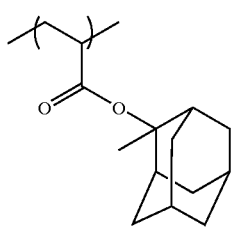

(5)-3
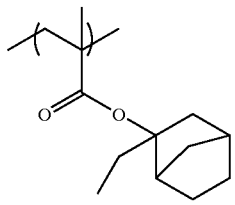

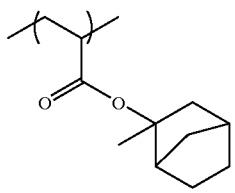
(5)-4

Also included in the acid labile groups represented by $R^{13}$ are silicon-containing acid labile groups of the formulae (A-7)-1 to (A-7)-6 and (A-8)-1 to (A-8)-6 below.

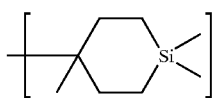
(A-7)-1

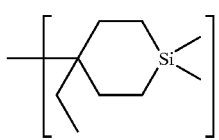
(A-7)-2

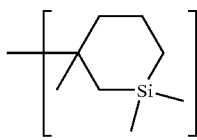
(A-7)-3

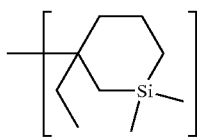
(A-7)-4

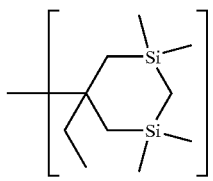
(A-7)-5

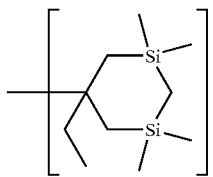
(A-7)-6

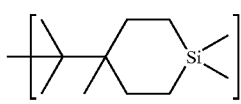
(A-8)-1

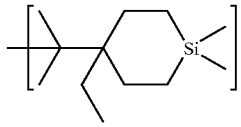
(A-8)-2

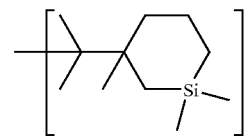
(A-8)-3

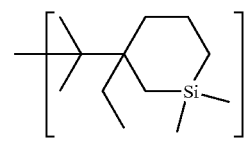
(A-8)-4

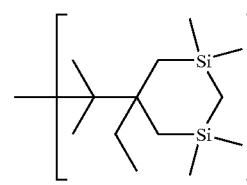
(A-8)-5

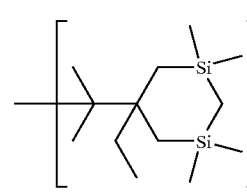
(A-8)-6

The silicon-containing polymers of the invention are improved in adhesion when $R^{13}$ in formula (5) is an adhesive group. Exemplary of the recurring units of formula (5) wherein $R^{13}$ is an adhesive group are units of the formulae (5)-5 to (5)-11 below.

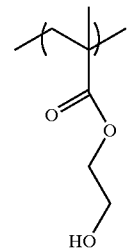
(5)-5

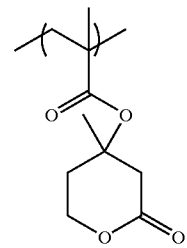
(5)-6

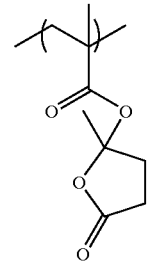
(5)-7

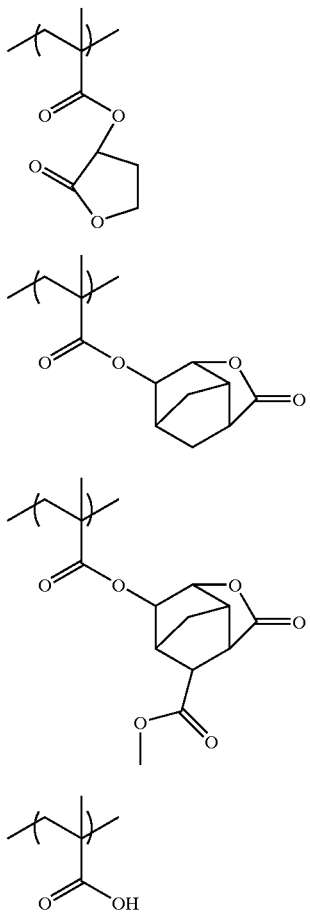

(5)-8

(5)-9

(5)-10

(5)-11

These (meth)acrylates may be contained alone or in admixture of two or more.

The polymers of the invention are generally represented by the formula below.

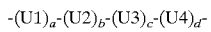

Herein U1 stands for silicon-containing units of formula (1) or (2), U2 stands for units of formula (3), U3 stands for units of formula (4), and U4 stands for units of formula (5). Subscript a is a positive number, b, c and d are 0 or positive numbers, and they preferably satisfy $0 < a/(a+b+c+d) \leq 0.9$, more preferably $0.05 \leq a/(a+b+c+d) \leq 0.8$, $0 \leq b/(a+b+c+d) \leq 0.8$, $0 \leq c/(a+b+c+d) \leq 0.8$, $0.1 \leq (b+c)/(a+b+c+d) \leq 0.8$, more preferably $0.3 \leq (b+c)/(a+b+c+d) \leq 0.7$, and $0 \leq d/(a+b+c+d) \leq 0.9$, more preferably $0.2 \leq d/(a+b+c+d) \leq 0.8$.

Pattern dimensions, pattern shape and etching resistance may be controlled as desired by selecting appropriate values of a, b, c and d within the above range.

In the inventive polymers, recurring units of the formulae (Si-1) to (Si-5) below may be incorporated for the purposes of increasing the silicon content and improving resistance to oxygen plasma etching.

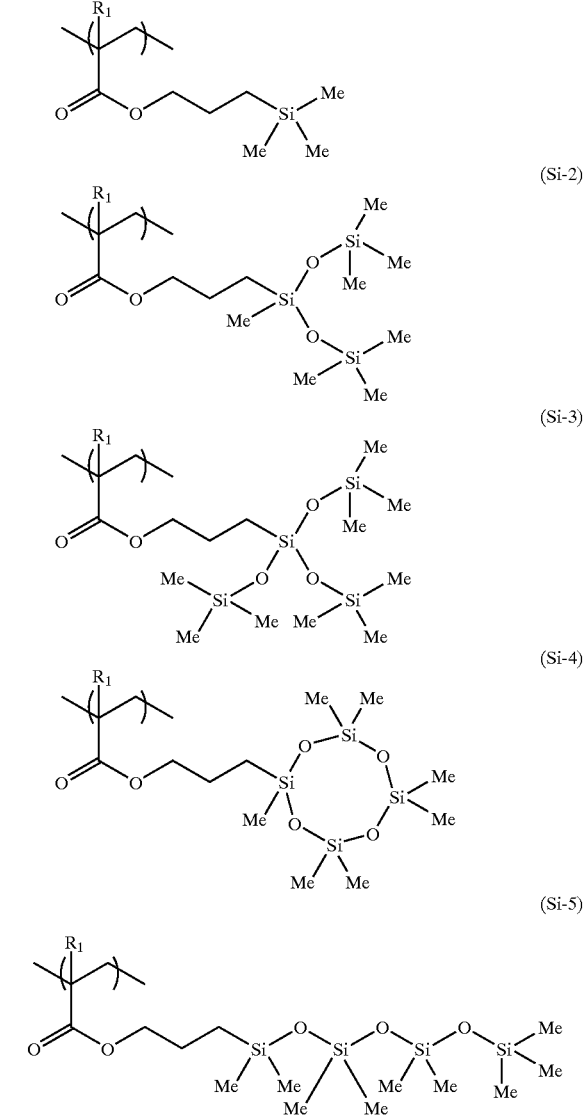

Herein, $R^1$ is as defined above and Me is methyl.

The polymers may have a weight average molecular weight (Mw) of about 1,000 to 500,000, and preferably about 2,000 to 30,000. With too low Mw, polymers become less resistant to heat. Polymers with too high Mw have low alkali solubility and tend to induce a footing phenomenon after pattern formation.

It is recommended that multi-component copolymers containing units of formulae (3) to (5), encompassed within the inventive polymers, have a controlled molecular weight dispersity (Mw/Mn). If a copolymer has a wide dispersity, it contains more polymer fractions of low molecular weight and high molecular weight and thus forms a pattern after exposure with foreign matter left thereon or its shape disrupted. The influence of a molecular weight and its dispersity becomes greater as the pattern rule becomes finer. In order that a resist composition be advantageously used in patterning features to a finer size, the multi-component copolymer should preferably be a narrow disperse one having a molecular weight dispersity of 1.0 to 2.0, especially 1.0 to 1.5.

In one typical embodiment, the polymer can be synthesized by dissolving a vinylsilane monomer and a comonomer(s) capable of providing recurring units of formulae (3) to (5) in an organic solvent, adding a radical initiator thereto, and heat polymerizing the monomers. Examples of the organic solvent used in polymerization include toluene, benzene, tetrahydrofuran, diethyl ether, dioxane and propylene glycol monomethyl ether acetate (PGMEA). Representative of the polymerization initiator are 2,2'-azobisisobutyronitrile, 2,2'-azobis(2,4-dimethylvalero-nitrile), dimethyl-2,2-azobis(2-methylpropionate), benzoyl peroxide and lauroyl peroxide. Polymerization may be effected by heating at about 50 to 80° C. The reaction time is usually about 2 to 100 hours, preferably about 5 to 20 hours. The synthesis of the inventive polymers is not limited to the above polymerization procedure.

Resist Composition

The polymer of the invention can be used as a base resin in resist compositions, specifically chemical amplification type resist compositions, and especially chemical amplification type positive working resist compositions.

In one embodiment, the chemically amplified positive resist composition is defined as comprising (A) the above-defined polymer as a base resin, (B) a photoacid generator, (C) an organic solvent, and preferably (D) a dissolution inhibitor and/or (E) a basic compound.

Component (B)

Suitable examples of the photoacid generator (B) include onium salts of general formula (8) below, diazomethane derivatives of formula (9), glyoxime derivatives of formula (10), β-ketosulfone derivatives, disulfone derivatives, nitrobenzylsulfonate derivatives, sulfonic acid ester derivatives, and imidoyl sulfonate derivatives.

The onium salts used as the photoacid generator are of the general formula (8).

$$(R^{21})_c M^+ K^- \tag{8}$$

In formula (8), $R^{21}$, which may be the same or different, is a straight, branched or cyclic alkyl of 1 to 12 carbon atoms, an aryl of 6 to 12 carbon atoms, or an aralkyl of 7 to 12 carbon atoms; $M^+$ is iodonium or sulfonium; $K^-$ is a non-nucleophilic counter-ion; and c is 2 or 3.

Illustrative examples of alkyl groups represented by $R^{21}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxy-phenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butyl-phenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 2,3,4,5,6-pentafluorobenzenesulfonate; and alkylsulfonate ions such as mesylate and butanesulfonate.

The diazomethane derivatives used as the photoacid generator are of the general formula (9).

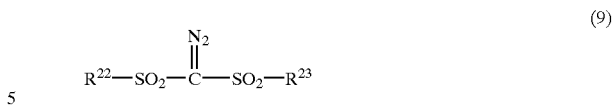

In the formula, $R^{22}$ and $R^{23}$, which may be the same or different, are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{22}$ and $R^{23}$ include methyl, ethyl, propyl, butyl, amyl, cyclopentyl, cyclohexyl, norbornyl, and adamantyl. Exemplary halogenated alkyl groups include trifluoromethyl, 2,2,2-trifluoroethyl, 2,2,2-trichloroethyl, and nonafluoro-butyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 2,3,4,5,6-pentafluorophenyl. Exemplary aralkyl groups include benzyl and phenethyl.

The glyoxime derivatives used as the photoacid generator are of the general formula (10).

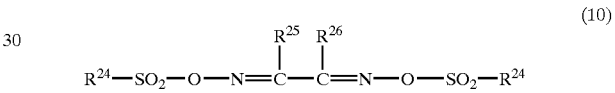

In the formula, $R^{24}$, $R^{25}$, and $R^{26}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{25}$, and $R^{26}$ may bond together to form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{24}$ to $R^{26}$ are exemplified by the same groups as mentioned above for $R^{22}$ and $R^{23}$. Examples of alkylene groups represented by $R^{25}$ and $R^{26}$ include methylene, ethylene, propylene, butylene, and hexylene.

Illustrative examples of the photoacid generator include: onium salts such as diphenyliodonium trifluoromethanesulfonate, (p-tert-butoxyphenyl) phenyliodonium trifluoromethanesulfonate, diphenyliodonium p-toluenesulfonate, (p-tert-butoxyphenyl) phenyliodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, bis (p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl) sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl)-diazomethane, bis(p-toluenesulfonyl)diazomethane, bis(xylenesulfonyl)diazomethane, bis(cyclohexylsulfonyl)-diazomethane, bis(cyclopentylsulfonyl)diazomethane, bis(n-butylsulfonyl) diazomethane, bis(isobutylsulfonyl) diazomethane, bis(sec-butylsulfonyl)diazomethane, bis(n-propylsulfonyl)diazomethane, bis(isopropylsulfonyl) diazomethane, bis(tert-butylsulfonyl)diazomethane, bis(n-amylsulfonyl)-diazomethane, bis(isoamylsulfonyl) diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)-diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

β-ketosulfone derivatives such as 2-cyclohexyl-carbonyl-2-(p-toluenesulfonyl)propane and 2-isopropyl-carbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, and tris(p-tert-butoxyphenyl)sulfonium p-toluenesulfonate; diazomethane derivatives such as bis(benzenesulfonyl)diazomethane, bis(p-toluenesulfonyl)diazomethane, bis(cyclohexylsulfonyl) diazomethane, bis(n-butylsulfonyl)diazomethane, bis(isobutylsulfonyl)diazomethane, bis(sec-butylsulfonyl) diazomethane, bis(n-propylsulfonyl)diazomethane, bis(isopropylsulfonyl)diazomethane, and bis(tert-butylsulfonyl)diazomethane; glyoxime derivatives such as bis-O-(p-toluenesulfonyl)-α-dimethylglyoxime and bis-O-(n-butanesulfonyl)-α-dimethylglyoxime; and naphthoquinone diazide sulfonate derivatives. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 50 parts, especially 0.5 to 40 parts by weight per 100 parts by weight of the entire base resin. At less than 0.2 part, the amount of acid generated during exposure would be too small and the sensitivity and resolution be poor, whereas the addition of more than 50 parts would lower the transmittance of the resist and result in a poor resolution.

Component (C)

The organic solvent (C) in the resist composition according to the invention may be any organic solvent in which the base resin (inventive polymer), photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol and ethyl lactate, in which the photoacid generator is most soluble, and propylene glycol monomethyl ether acetate which is safe, and mixtures thereof.

Component (D)

The dissolution inhibitor (D) is a compound with a molecular weight of up to 3,000 which changes its solubility in an alkaline developer under the action of an acid. Typically, a compound obtained by partially or entirely substituting acid labile substituents on a phenol or carboxylic acid derivative having a molecular weight of up to 2,500 is added as the dissolution inhibitor. The acid labile groups may be well-known groups.

Examples of the phenol or carboxylic acid derivative having a molecular weight of up to 2,500 include 4,4'-(1-methylethylidene)bisphenol, (1,1'-biphenyl-4,4'-diol)-2,2'-methylenebis(4-methylphenol), 4,4-bis(4'-hydroxyphenyl)-valeric acid, tris(4-hydroxyphenyl)methane, 1,1,1-tris(4'-hydroxyphenyl)ethane, 1,1,2-tris(4'-hydroxyphenyl)ethane, phenolphthalein, thimolphthalein, 3,3'-difluoro[(1,1'-biphenyl)-4,4'-diol], 3,3', 5,5'-tetrafluoro[(1,1'-biphenyl)-4,4'-diol], 4,4'-[2,2,2-trifluoro-1-(trifluoromethyl)-ethylidene]bisphenol, 4,4'-methylenebis(2-fluorophenol), 2,2'-methylenebis(4-fluorophenol), 4,4'-isopropylidenebis(2-fluorophenol), cyclohexylidenebis(2-fluorophenol), 4,4'-[(4- fluorophenyl)methylene]bis(2-fluorophenol), 4,4'-methylenebis(2,6-difluorophenol), 4,4'-(4-fluorophenyl)methylenebis(2,6-difluorophenol), 2,6-bis[(2-hydroxy-5-fluorophenyl)-methyl]-4-fluorophenol, 2,6-bis[(4-hydroxy-3-fluorophenyl)methyl]-4-fluorophenol, and 2,4-bis[(3-hydroxy-4-hydroxyphenyl)methyl]-6-methylphenol. The acid labile substituents are well-known ones.

Illustrative, non-limiting, examples of the dissolution inhibitors which are useful herein include 3,3',5,5'-tetrafluoro[(1,1'-biphenyl)-4,4'-di-t-butoxycarbonyl], 4,4'-[2,2,2-trifluoro-1-(trifluoromethyl)ethylidene]bisphenol-4,4'-di-t-butoxycarbonyl, bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)-methane, 2,2-bis(4'-(2"-tetrahydropyranyloxy))propane, 2,2-bis(4'-(2"-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxy-carbonylmethyloxyphenyl)propane, 2,2-bis(4'-(1"-ethoxyethoxy)phenyl)propane, 2,2-bis(4'-(1"-ethoxypropyloxy)-phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxy-ethoxy)phenyl)methane, tris(4-(1'-ethoxypropyloxy)phenyl)methane, 1,1,2-tris(4-(2"-tetrahydropyranyloxy)phenyl)ethane, 1,1,2-tris(4'-(2"-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, 1,1,2-tris(4'-(1'-ethoxypropyloxy)phenyl)ethane, t-butyl 2-trifluoromethylbenzenecarboxylate, t-butyl 2-trifluoromethylcyclohexanecarboxylate, t-butyl decahydronaphthalene-2,6-dicarboxylate, t-butyl cholate, t-butyl deoxycholate, t-butyl adamantanecarboxylate, t-butyl adamantaneacetate, and tetra-t-butyl 1,1'-bicyclohexyl-3,3',4,4'-tetracarboxylate.

In the resist composition according to the invention, an appropriate amount of the dissolution inhibitor (D) is up to about 20 parts, and especially up to about 15 parts by weight per 100 parts by weight of the base resin in the composition. With more than 20 parts of the dissolution inhibitor, the resist composition becomes less heat resistant because of an increased content of monomer components.

Component (E)

The basic compound (E) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, the aliphatic amines are preferred.

Examples of suitable primary aliphatic amines include ammonia, methylamine, ethylamine, n-propylamine, isopropylamine, n-butylamine, iso-butylamine, sec-butylamine, tertbutylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of suitable secondary aliphatic amines include dimethylamine, diethylamine, di-n-propylamine, di-isopropylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylene-diamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene; and pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-l-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-amino-pyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)-pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

$$N(X)_n(Y)_{3-n} \quad (B)\text{-}1$$

In the formula, n is equal to 1, 2 or 3; side chain X, which may be the same or different, is independently selected from groups of the following general formulas (X)-1 to (X)-3, and two or three X's may bond together to form a ring; and side chain Y, which may be the same or different, is independently hydrogen or a straight, branched or cyclic alkyl group of 1 to 20 carbon atoms which may contain a hydroxyl group or ether.

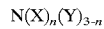   (X)-1

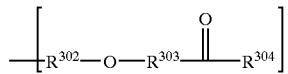

(X)-2

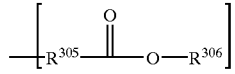

(X)-3

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl group, ether, ester or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl group, ether, ester or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}-amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris (2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)

ethylamine, N-(2-hydroxyethyl)-bis[2-(methoxycarbonyl)
ethyl]amine, N-(2-acetoxyethyl)-bis[2-(methoxycarbonyl)
ethyl]amine, N-(2-hydroxyethyl)-bis[2-(ethoxycarbonyl)
ethyl]amine, N-(2-acetoxyethyl)-bis[2-(ethoxycarbonyl)
ethyl]amine, N-(3-hydroxy-1-propyl)-bis[2-
(methoxycarbonyl)ethyl]amine, N-(3-acetoxy-1-propyl)-bis
[2-(methoxycarbonyl)ethyl]amine, N-(2-methoxyethyl)-bis
[2-(methoxycarbonyl)ethyl]amine, N-butyl-bis[2-
(methoxycarbonyl)ethyl]amine, N-butyl-bis[2-(2-
methoxyethoxy-carbonyl)ethyl]amine, N-methyl-bis(2-
acetoxyethyl)amine, N-ethyl-bis(2-acetoxyethyl)amine,
N-methyl-bis(2-pivaloyloxyethyl)amine, N-ethyl-bis[2-
(methoxycarbonyloxy)ethyl]-amine, N-ethyl-bis[2-(tert-
butoxycarbonyloxy)ethyl]amine, tris
(methoxycarbonylmethyl)amine, tris
(ethoxycarbonylmethyl)amine, N-butyl-bis
(methoxycarbonylmethyl)amine, N-hexyl-bis
(methoxycarbonylmethyl)amine, and β-(diethylamino)-δ-
valerolactone.

Also useful are one or more of cyclic structure-bearing
basic compounds having the following general formula
(B)-2.

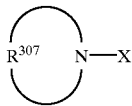

(B)-2

Herein X is as defined above, and $R^{307}$ is a straight or
branched alkylene group of 2 to 20 carbon atoms which may
contain one or more carbonyl, ether, ester or sulfide groups.

Illustrative examples of the cyclic structure-bearing basic
compounds having formula (B)-2 include 1-[2-(methoxy-
methoxy)ethyl]pyrrolidine, 1-[2-(methoxymethoxy)ethyl]-
piperidine, 4-[2-(methoxymethoxy)ethyl]morpholine, 1-[2-
[(2-methoxyethoxy)methoxy]ethyl]pyrrolidine, 1-[2-[(2-
methoxy-ethoxy)methoxyl]ethyl]piperidine, 4-[2-[(2-
methoxyethoxy)-methoxy]ethyl]morpholine, 2-(1-
pyrrolidinyl)ethyl acetate, 2-piperidinoethyl acetate,
2-morpholinoethyl acetate, 2-(1-pyrrolidinyl)ethyl formate,
2-piperidinoethyl propionate, 2-morpholinoethyl
acetoxyacetate, 2-(1-pyrrolidinyl)ethyl methoxyacetate,
4-[2-(methoxycarbonyloxy)ethyl]morpholine, 1-[2-(t-
butoxycarbonyloxy)ethyl]piperidine, 4-[2-(2-
methoxyethoxycarbonyloxy)ethyl]morpholine, methyl 3-(1-
pyrrolidinyl)propionate, methyl 3-piperidinopropionate,
methyl 3-morpholinopropionate, methyl 3-(thiomorpholino)
propionate, methyl 2-methyl-3-(1-pyrrolidinyl)propionate,
ethyl 3-morpholinopropionate, methoxycarbonylmethyl
3-piperidinopropionate, 2-hydroxyethyl 3-(1-pyrrolidinyl)
propionate, 2-acetoxyethyl 3-morpholinopropionate,
2-oxotetrahydrofuran-3-yl 3-(1-pyrrolidinyl)propionate, tet-
rahydrofurfuryl 3-morpholinopropionate, glycidyl
3-piperidinopropionate, 2-methoxyethyl
3-morpholinopropionate, 2-(2-methoxyethoxy)ethyl 3-(1-
pyrrolidinyl)propionate, butyl 3-morpholinopropionate,
cyclohexyl 3-piperidinopropionate, α-(1-pyrrolidinyl)
methyl-γ-butyrolactone, β-piperidino-γ-butyrolactone,
β-morpholino-δ-valerolactone, methyl
1-pyrrolidinylacetate, methyl piperidinoacetate, methyl
morpholinoacetate, methyl thiomorpholinoacetate, ethyl
1-pyrrolidinylacetate, and 2-methoxyethyl morpholinoac-
etate.

Also, one or more of cyano-bearing basic compounds
having the following general formulae (B)-3 to (B)-6 may be
blended.

(B)-3

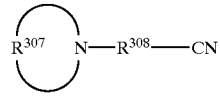

(B)-4

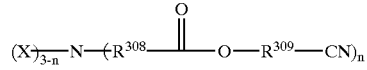

(B)-5

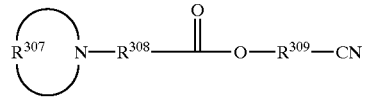

(B)-6

Herein, X, $R^{307}$ and n are as defined above, and $R^{308}$ and
$R^{309}$ each are independently a straight or branched alkylene
group of 1 to 4 carbon atoms.

Illustrative examples of the cyano-bearing basic com-
pounds include 3-(diethylamino)propiononitrile, N,N-bis(2-
hydroxyethyl)-3-aminopropiononitrile, N,N-bis(2-
acetoxyethyl)-3-aminopropiononitrile, N,N-bis(2-
formyloxyethyl)-3-aminopropiononitrile, N,N-bis(2-
methoxyethyl)-3-aminopropiononitrile, N,N-bis[2-
(methoxymethoxy)ethyl]-3-aminopropiononitrile, methyl
N-(2-cyanoethyl)-N-(2-methoxyethyl)-3-aminopropionate,
methyl N-(2-cyanoethyl)-N-(2-hydroxyethyl)-3-
aminopropionate, methyl N-(2-acetoxyethyl)-N-(2-
cyanoethyl)-3-aminopropionate, N-(2-cyanoethyl)-N-ethyl-
3-aminopropiononitrile, N-(2-cyanoethyl)-N-(2-hydroxy-
ethyl)-3-aminopropiononitrile, N-(2-acetoxyethyl)-N-(2-
cyanoethyl)-3-aminopropiononitrile, N-(2-cyanoethyl)-N-
(2-formyloxyethyl)-3-aminopropiononitrile, N-(2-
cyanoethyl)-N-(2-methoxyethyl)-3-aminopropiononitrile,
N-(2-cyanoethyl)-N-[2-(methoxymethoxy)ethyl]-3-
aminopropiononitrile, N-(2-cyanoethyl)-N-(3-hydroxy-1-
propyl)-3-aminopropiononitrile, N-(3-acetoxy-1-propyl)-N-
(2-cyanoethyl)-3-aminopropiononitrile, N-(2-cyanoethyl)-
N-(3-formyloxy-1-propyl)-3-aminopropiononitrile, N-(2-
cyanoethyl)-N-tetrahydrofurfuryl-3-aminopropiononitrile,
N,N-bis(2-cyanoethyl)-3-aminopropiononitrile,
diethylaminoacetonitrile, N,N-bis(2-hydroxyethyl)
aminoacetonitrile, N,N-bis(2-acetoxyethyl)
aminoacetonitrile, N,N-bis(2-formyloxyethyl)
aminoacetonitrile, N,N-bis(2-methoxyethyl)
aminoacetonitrile, N,N-bis[2-(methoxymethoxy)ethyl]
aminoacetonitrile, methyl N-cyanomethyl-N-(2-
methoxyethyl)-3-aminopripionate, methyl N-cyanomethyl-
N-(2-hydroxyethyl)-3-aminopropionate, methyl N-(2-
acetoxyethyl)-N-cyanomethyl-3-aminopropionate,
N-cyanomethyl-N-(2-hydroxyethyl)-aminoacetonitrile,
N-(2-acetoxyethyl)-N-(cyanomethyl)aminoacetonitrile,
N-cyanomethyl-N-(2-formyloxyethyl)aminoacetonitrile,
N-cyanomethyl-N-(2-methoxyethyl)aminoacetonitrile,
N-cyanomethyl-N-[2-(methoxymethoxy)ethyl]
aminoacetonitrile, N-cyanomethyl-N-(3-hydroxy-1-propyl)
aminoacetonitrile, N-(3-acetoxy-1-propyl)-N-
(cyanomethyl)aminoacetonitrile, N-cyanomethyl-N-(3-
formyloxy-1-propyl)aminoacetonitrile, N,N-bis
(cyanomethyl)aminoacetonitrile,
1-pyrrolidinepropiononitrile, 1-piperidinepropiononitrile,
4-morpholinepropiononitrile, 1-pyrrolidineacetonitrile,
1-piperidineacetonitrile, 4-morpholineacetonitrile, cyanom-
ethyl 3-diethylaminopropionate, cyanomethyl N,N-bis(2-
hydroxyethyl)-3-aminopropionate, cyanomethyl N,N-bis(2- acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)-ethyl]-3-aminopropionate, 2-cyanoethyl 3-diethylaminoproplonate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis(2-(methoxymethoxy)-ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

The basic compounds may be used alone or in admixture of two or more. The basic compound is preferably formulated in an amount of 0.001 to 2 parts, and especially 0.01 to 1 part by weight, per 100 parts by weight of the entire base resin in the resist composition. Less than 0.001 part of the basic compound would fail to provide the desired effect whereas more than 2 parts of the basic compound would result in too low a sensitivity.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, and fluorinated organosiloxane compounds. Illustrative examples include Florade FC-430 and FC-431 from Sumitomo 3M Ltd., Surflon S-141, S-145, S-381 and S-383 from Asahi Glass Co., Ltd., Unidyne DS-401, DS-403, and DS-451 from Daikin Industries Ltd., Megaface F-8151, F-171, F-172, F-173 and F-177 from Dainippon Ink & Chemicals, Inc., and X-70–092 and X-70–093 from Shin-Etsu Chemical Co., Ltd. Preferred surfactants include Florade FC-430 from Sumitomo 3M Ltd. and X-70–093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 $\mu$m, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation having a wavelength of less than 300 nm, such as deep-UV rays, excimer laser beams, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to micro-pattern formation with, in particular, deep-UV rays having a wavelength of 254 to 120 nm, an excimer laser, especially ArF excimer laser (193 nm), $F_2$ laser (157 nm), $Kr_2$ excimer laser (146 nm), KrAr excimer laser (134 nm) or $Ar_2$ laser (126 nm), x-rays, or an electron beam. The desired pattern may not be obtainable outside the upper and lower limits of the above range.

Figure 1B:
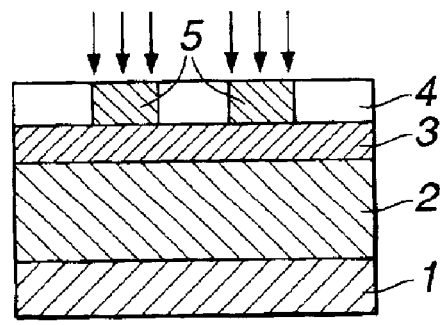
Figure 1C:
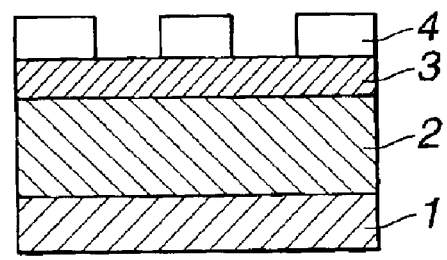
Figure 1D:
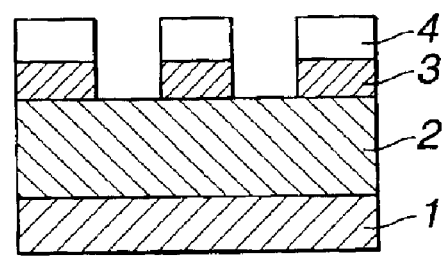
Figure 1E:
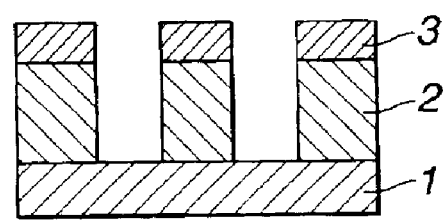

Referring to FIG. 1, there is illustrated in cross section a process involving forming a silicon-containing resist pattern through exposure, PEB and development steps, patterning an underlying organic film by oxygen gas etching, and processing a further underlying film by dry etching. In FIG. 1A, a layer structure includes a support substrate 1, a processable substrate 2 of $SiO_2$, SiN or the like, an organic film 3 of a novolac resin, polyhydroxystyrene or the like, and a resist layer 4 of a resist composition comprising a silicon-containing polymer according to the invention. In FIG. 1B, selected areas 5 of the resist layer 4 are exposed to light. PEB and development are then carried out to remove the exposed areas as shown in FIG. 1C. In FIG. 1D, the exposed areas of the organic film 3 are etched away with oxygen plasma. In FIG. 1E, the exposed areas of the processable substrate 2 are etched away with CF gas, completing the pattern.

The oxygen gas etching is a reactive plasma etching using oxygen gas as a main component and can process the underlying organic film at a high aspect ratio. $SO_2$ or $N_2$ gas may be added to oxygen gas for protecting side walls for preventing the film from being configured to a T-top profile by overetching. Prior to the oxygen gas etching, brief etching with a fluorocarbon gas may be carried out for removing any scum of the resist after development and smoothening line edges to prohibit roughening. The subsequent dry etching of the processable film may be etching using a fluorocarbon gas as a main component when the processable film is $SiO_2$ or $Si_3N_4$. Exemplary fluorocarbon gases are $CF_4$, $CHF_3$, $CH_2F_2$, $C_2F_6$, $C_3F_8$, $C_4F_{10}$ and $C_{5\ F12}$. At the same time as the dry etching of the processable film, the silicon-containing resist film can be stripped off. Etching with chlorine or bromine gas as a main component is employed when the processable film is polysilicon, tungsten silicide or TiN/Al.

Since the silicon-containing resist according to the invention has excellent resistance to etching with chlorine or bromine gas as a main component, the processing technique may be the same as used for the single layer resist.

Figure 2A:
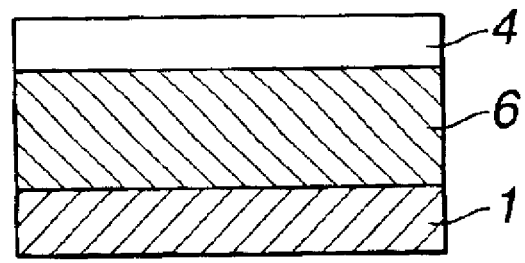
FIG. 2 schematically illustrates a layer structure patterning process involving chlorine etching.
Figure 2B:
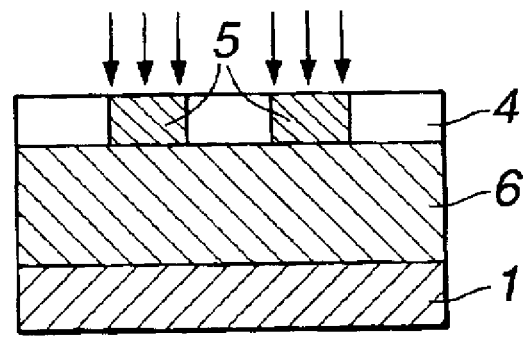
Figure 2C:
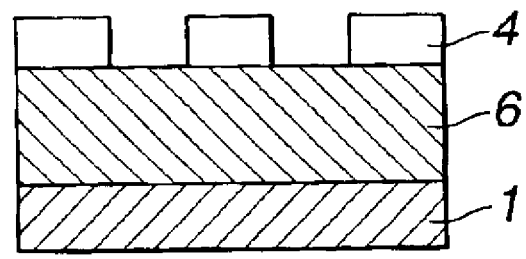
Figure 2D:
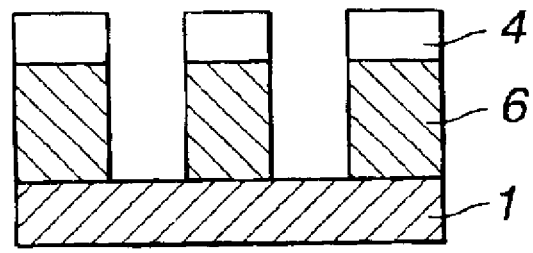

This embodiment is illustrated in FIG. 2. The layer structure shown in FIG. 2A includes a support substrate 1, a processable substrate 6, and a resist layer 4 according to the invention. Exposure of selected areas 5 of the resist layer 4 is followed by PEB and development as shown in FIGS. 2B and 2C. Thereafter, the processable substrate 6 is etched with a Cl gas as shown in FIG. 2D. In this embodiment, the silicon-containing resist film according to the invention is formed directly on the processable film, which can be processed by etching with chlorine or bromine gas as a main component.

The resist composition comprising a silicon-containing polymer as a base resin according to the invention is sensitive to high-energy radiation, and has excellent sensitivity and resolution at a wavelength of less than 300 nm as well as satisfactory oxygen plasma etching resistance. These features of the inventive resist composition enable its use particularly in the two-layer resist technology, and permit a finely defined pattern having sidewalls perpendicular to the substrate to be easily be formed, making the resist ideal as a micropatterning material in VLSI fabrication.

EXAMPLE

Synthesis Examples and Examples are given below together with Comparative Examples for further illustrating the invention although the invention is not limited thereby. The abbreviations used herein are GPC for gel permeation chromatography, NMR for nuclear magnetic resonance, Mw for weight average molecular weight, and Mn for number average molecular weight.

Synthesis Example 1

A 200-ml flask was charged with 19.8 g of maleic anhydride, 20.2 g of trimethylvinylsilane and 20 g of tetrahydrofuran as a solvent. The reactor was cooled down to −70° C. in a nitrogen atmosphere, followed by three cycles of vacuum deaeration and nitrogen blow. After warming up to room temperature, 4.0 g of 2,2"-azobis(2,4-dimethylvaleronitrile) as a polymerization initiator was added. The reactor was then heated to 55° C., at which reaction was effected for 25 hours. The reaction solution was diluted with 5 ml of acetone and poured to 4.5 liters of isopropyl alcohol for precipitation. The resulting white solids were collected by filtration and vacuum dried at 40° C., obtaining 29 g of a white polymer.

The polymer was analyzed by $^{13}$C-NMR, $^{1}$H-NMR and GPC, with the results shown below.
Copolymer compositional ratio: maleic anhydride/trimethylvinylsilane=43.7/56.3
Mw=4,600
Molecular weight dispersity (Mw/Mn)=1.48
This is designated Polymer A.

Synthesis Example 2

A 200-ml flask was charged with 21.1 g of N-methylmaleimide, 20.5 g of trimethylvinylsilane and 20 g of tetrahydrofuran as a solvent. The reactor was cooled down to −70° C. in a nitrogen atmosphere, followed by three cycles of vacuum deaeration and nitrogen blow. After warming up to room temperature, 4.1 g of 2,2'-azobis(2,4-dimethylvaleronitrile) as a polymerization initiator was added. The reactor was then heated to 55° C., at which reaction was effected for 25 hours. The reaction solution was diluted with 5 ml of acetone and poured to 4.5 liters of isopropyl alcohol for precipitation. The resulting white solids were collected by filtration and vacuum dried at 40° C., obtaining 31 g of a white polymer.

The polymer was analyzed by $^{13}$C-NMR, $^{1}$H-NMR and GPC, with the results shown below.
Copolymer compositional ratio: N-methylmaleimide/trimethylvinylsilane=48.2/51.8
Mw=5,200
Mw/Mn=1.56
This is designated Polymer B.

Synthesis Example 3

A 200-ml flask was charged with 16.1 g of fumaronitrile, 21.9 g of trimethylvinylsilane and 40 g of tetrahydrofuran as a solvent. The reactor was cooled down to −70° C. in a nitrogen atmosphere, followed by three cycles of vacuum deaeration and nitrogen blow. After warming up to room temperature, 3.3 g of 2,2'-azobis(2,4-dimethylvaleronitrile) as a polymerization initiator was added. The reactor was then heated to 55° C., at which reaction was effected for 25 hours. The reaction solution was diluted with 5 ml of acetone and poured to 4.5 liters of methanol for precipitation. The resulting white solids were collected by filtration and vacuum dried at 40° C., obtaining 22 g of a white polymer.

The polymer was analyzed by $^{13}$C-NMR, $^{1}$H-NMR and GPC, with the results shown below.
Copolymer compositional ratio: fumaronitrile/trimethylvinylsilane=49.5/50.5
Mw=3,800
Mw/Mn=1.47
This is designated Polymer C.

Synthesis Example 4

A 100-ml autoclave reactor was charged with 21.1 g of trimethylvinylsilane and 40 g of tetrahydrofuran as a solvent. The reactor was cooled down to −70° C. in a nitrogen atmosphere, followed by three cycles of vacuum deaeration and nitrogen blow. After warming up to room temperature, 30 g of tetrafluoroethylene gas was injected and 3.3 g of 2,2'-azobis(2,4-dimethylvaleronitrile) as a polymerization initiator was added. The reactor was then heated to 55° C., at which reaction was effected for 25 hours. After nitrogen replacement, the reaction solution was poured to 4.5 liters of methanol for precipitation. The resulting white solids were collected by filtration and vacuum dried at 30° C., obtaining 14 g of a white polymer.

The polymer was analyzed by $^{13}$C-NMR, $^{1}$H-NMR and GPC, with the results shown below.
Copolymer compositional ratio: tetrafluoroethylene/trimethylvinylsilane=52.3/47.7
Mw=8,200
Mw/Mn=1.68
This is designated Polymer D.

Synthesis Example 5

A 200-ml flask was charged with 10.2 g of maleic anhydride, 29.9 g of vinylheptamethylcyclotetrasiloxane and 20 g of tetrahydrofuran as a solvent. The reactor was cooled down to −70° C. in a nitrogen atmosphere, followed by three cycles of vacuum deaeration and nitrogen blow. After warming up to room temperature, 2.1 g of 2,2'-azobis(2,4-dimethylvaleronitrile) as a polymerization initiator was added. The reactor was then heated to 55° C., at which reaction was effected for 25 hours. The reaction solution was diluted with 5 ml of acetone and poured to 4.5 liters of isopropyl alcohol for precipitation. The resulting white solids were collected by filtration and vacuum dried at 40° C., obtaining 28 g of a white polymer.

The polymer was analyzed by $^{13}$C-NMR, $^{1}$H-NMR and GPC, with the results shown below.
Copolymer compositional ratio: maleic anhydride/vinylheptamethylcyclotetrasiloxane=48.9/51.1
Mw=8,200
Mw/Mn=1.36
This is designated Polymer E.

Synthesis Example 6

A 200-ml flask was charged with 9.7 g of maleic anhydride, 29.2 g of bis(trimethylsilylmethyl) vinylmethylsilane and 10 g of tetrahydrofuran as a solvent. The reactor was cooled down to −70° C. in a nitrogen atmosphere, followed by three cycles of vacuum deaeration and nitrogen blow. After warming up to room temperature, 2.2 g of 2,2'-azobis(2,4-dimethylvaleronitrile) as a polymerization initiator was added. The reactor was then heated to 55° C., at which reaction was effected for 25 hours. The reaction solution was diluted with 5 ml of acetone and poured to 4.5 liters of isopropyl alcohol for precipitation. The resulting white solids were collected by filtration and vacuum dried at 40° C., obtaining 21 g of a white polymer.

The polymer was analyzed by $^{13}$C-NMR, $^1$H-NMR and GPC, with the results shown below.

Copolymer compositional ratio: maleic anhydride/bis(trimethylsilylmethyl)vinylmethylsilane=51.2/48.8
Mw=7,600
Mw/Mn=1.41

This is designated Polymer F.

Synthesis Example 7

A 200-ml flask was charged with 13.6 g of maleic anhydride, 13.9 g of trimethylvinylsilane, 12.6 g of 1-ethylcyclopentyl methacrylate and 20 g of tetrahydrofuran as a solvent. The reactor was cooled down to −70° C. in a nitrogen atmosphere, followed by three cycles of vacuum deaeration and nitrogen blow. After warming up to room temperature, 3.4 g of 2,2'-azobis(2,4-dimethylvaleronitrile) as a polymerization initiator was added. The reactor was then heated to 55° C., at which reaction was effected for 25 hours. The reaction solution was diluted with 10 ml of acetone and poured to 4.5 liters of isopropyl alcohol for precipitation. The resulting white solids were collected by filtration and vacuum dried at 40° C., obtaining 33 g of a white polymer.

The polymer was analyzed by $^{13}$C-NMR, $^1$H-NMR and GPC, with the results shown below.

Copolymer compositional ratio: maleic anhydride/trimethylvinylsilane/1-ethylcyclopentyl methacrylate=43.6/24.6/31.8
Mw=15,000
Mw/Mn=2.3

This is designated Polymer G.

Synthesis Example 8

A 200-ml flask was charged with 8.1 g of maleic anhydride, 24.3 g of vinylheptamethylcyclotetrasiloxane, 7.5 g of 1-ethylcyclopentyl methacrylate and 10 g of tetrahydrofuran as a solvent. The reactor was cooled down to −70° C. in a nitrogen atmosphere, followed by three cycles of vacuum deaeration and nitrogen blow. After warming up to room temperature, 2.1 g of 2,2'-azobis(2,4-dimethylvaleronitrile) as a polymerization initiator was added. The reactor was then heated to 55° C., at which reaction was effected for 25 hours. The reaction solution was diluted with 10 ml of acetone and poured to 4.5 liters of isopropyl alcohol for precipitation. The resulting white solids were collected by filtration and vacuum dried at 40° C., obtaining 27 g of a white polymer.

The polymer was analyzed by $^{13}$C-NMR, $^1$H-NMR and GPC, with the results shown below.

Copolymer compositional ratio: maleic anhydride/vinylheptamethylcyclotetrasiloxane/1-ethylcyclopentyl methacrylate=39.7/19.3/41.0
Mw=14,700
Mw/Mn=2.2

This is designated Polymer H.

Synthesis Example 9

A 200-ml flask was charged with 8.7 g of maleic anhydride, 27.2 g of bis(trimethylsilylmethyl)vinylmethylsilane, 4.1 g of 1-ethylcyclopentyl methacrylate and 10 g of tetrahydrofuran as a solvent. The reactor was cooled down to −70° C. in a nitrogen atmosphere, followed by three cycles of vacuum deaeration and nitrogen blow. After warming up to room temperature, 2.2 g of 2,2'-azobis(2,4-dimethylvaleronitrile) as a polymerization initiator was added. The reactor was then heated to 55° C., at which reaction was effected for 25 hours. The reaction solution was diluted with 10 ml of acetone and poured to 4.5 liters of isopropyl alcohol for precipitation. The resulting white solids were collected by filtration and vacuum dried at 40° C., obtaining 24 g of a white polymer.

The polymer was analyzed by $^{13}$C-NMR, $^1$H-NMR and GPC, with the results shown below.

Copolymer compositional ratio: maleic anhydride/bis(trimethylsilylmethyl)vinylmethylsilane/1-ethylcyclopentyl methacrylate=35.4/15.2/49.4
Mw=10,800
Mw/Mn=1.89

This is designated Polymer I.

Synthesis Example 10

A 200-ml flask was charged with 7.5 g of maleic anhydride, 22.1 g of vinylheptamethylcyclotetrasiloxane, 9.9 g of 1-ethyladamantyl methacrylate and 10 g of tetrahydrofuran as a solvent. The reactor was cooled down to −70° C. in a nitrogen atmosphere, followed by three cycles of vacuum deaeration and nitrogen blow. After warming up to room temperature, 2.0 g of 2,2'-azobis(2,4-dimethylvaleronitrile) as a polymerization initiator was added. The reactor was then heated to 55° C., at which reaction was effected for 25 hours. The reaction solution was diluted with 10 ml of acetone and poured to 4.5 liters of isopropyl alcohol for precipitation. The resulting white solids were collected by filtration and vacuum dried at 40° C., obtaining 30 g of a white polymer.

The polymer was analyzed by $1^3$C-NMR, $^1$H-NMR and GPC, with the results shown below.

Copolymer compositional ratio: maleic anhydride/vinylheptamethylcyclotetrasiloxane/1-ethyladamantyl methacrylate=49.4/15.4/35.2
Mw=16,600
Mw/Mn=1.89

This is designated Polymer J.

Comparative Polymer Synthesis Example 1

Synthesis of tris(trimethylsilyl)silylethyl methacrylate/5-oxo-4-oxatricyclo [4.2.1.0$^{3,7}$]nonan-2-yl methacrylate (7:3) Copolymer A copolymer was synthesized as in Polymer Synthesis Example 1. The polymer was confirmed by the light scattering method to have a Mw of 11,000 g/mol and by the GPC elution curve to have a dispersity (Mw/Mn) of 1.65. By $^1$H-NMR analysis, the copolymer was found to contain the two components in a ratio of approximately 7:3.

Comparative Polymer Synthesis Example 2

Synthesis of 3-[tris(trimethylsilyloxy)silyl]propyl methacrylate/t-butyl methacrylate/5-oxo-oxatricyclo [4.2.1.0$^{3,7}$]nonan-2-yl methacrylate (2:5:3) Copolymer A copolymer was synthesized as in Polymer Synthesis Example 1. The polymer was confirmed by the light scattering method to have a Mw of 13,000 g/mol and by the GPC elution curve to have a dispersity (Mw/Mn) of 1.78. By $^1$H-NMR analysis, the copolymer was found to contain the components in a ratio of approximately 2:5:3.

The polymers synthesized above have the structural formulae shown below.

Polymer-A
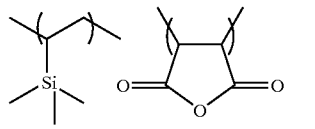

Polymer-B
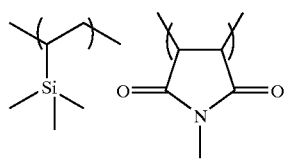

Polymer-C
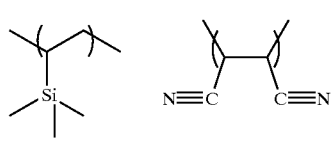

Polymer-D
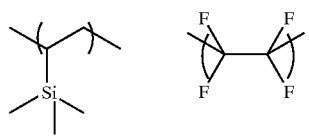

Polymer-E
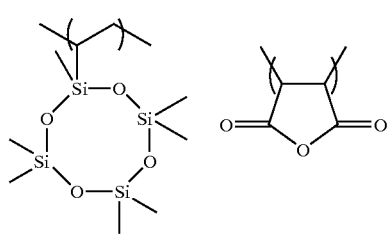

Polymer-F
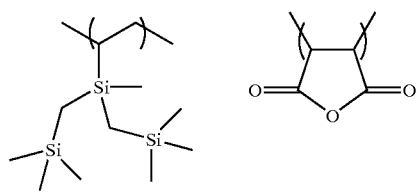

Polymer-G
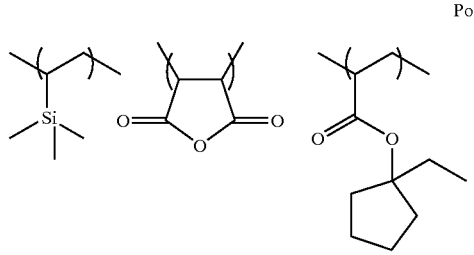

Polymer-H
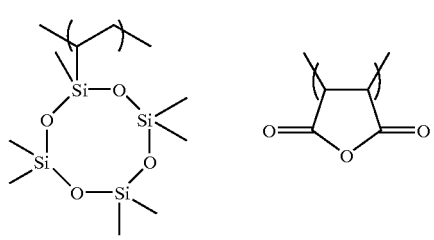

-continued

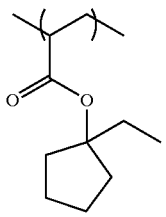

Polymer-I
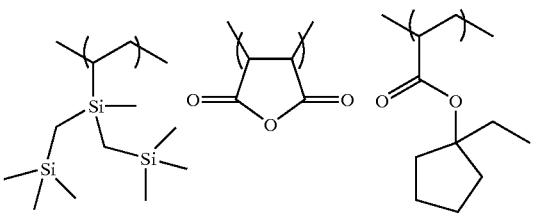

Polymer-J
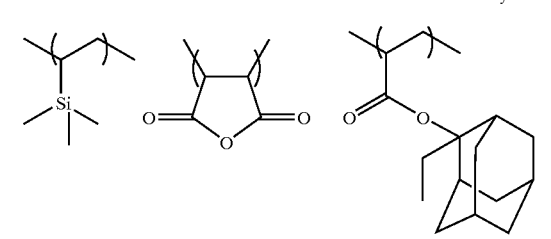

Dry Etching Test

A polymer solution was prepared by thoroughly dissolving 1 g of each of the above-synthesized polymers in 5 g of propylene glycol monomethyl ether acetate and passing the solution through a 0.1 μm filter. The polymer solution was applied to a silicon wafer, baked at 100° C. for 90 seconds to form a polymer film of 500 nm thick. The wafer having the polymer film formed thereon was subjected to dry etching under two sets of conditions. A difference in polymer film thickness before and after the etching test was determined.

(1) $O_2$ etching test:

Using a dry etching instrument TE-8500P by Tokyo Electron K.K., the resist films were etched with oxygen gas under the following conditions.

| | |
|---|---|
| Chamber pressure | 60 Pa |
| RF power | 600 W |
| Ar gas flow rate | 40 ml/min |
| $O_2$ gas flow rate | 60 ml/min |
| Gap | 9 mm |
| Time | 60 sec |

The thickness of polymer film was measured, from which a difference in polymer film thickness before and after the etching was determined.

(2) $Cl_2/BCl_3$ etching test:

Using a dry etching instrument L-507D-L by Nichiden Anerba K.K., the resist films were etched with halide gases under the following conditions.

| | |
|---|---|
| Chamber pressure | 40 Pa |
| RF power | 300 W |
| Gap | 9 mm |

-continued

| | |
|---|---|
| Cl₂ gas flow rate | 30 ml/min |
| BCl₃ gas flow rate | 30 ml/min |
| CHF₃ gas flow rate | 100 ml/min |
| O₂ gas flow rate | 2 ml/min |
| Time | 60 sec |

The thickness of polymer film was measured, from which a difference in polymer film thickness before and after the etching was determined.

The results are shown in Table 1.

TABLE 1

| Polymer | O₂ gas etching rate (nm/min) | Cl₂/BCl₃ gas etching rate (nm/min) |
|---|---|---|
| Polymer A | 232 | 218 |
| Polymer B | 250 | 240 |
| Polymer C | 180 | 177 |
| Polymer D | 380 | 250 |
| Polymer E | 170 | 190 |
| Polymer F | 150 | 160 |
| Polymer G | 520 | 106 |

TABLE 1-continued

| Polymer | O₂ gas etching rate (nm/min) | Cl₂/BCl₃ gas etching rate (nm/min) |
|---|---|---|
| Polymer H | 480 | 108 |
| Polymer I | 110 | 210 |
| Polymer J | 180 | 350 |
| Comparative Polymer 1 | 580 | 380 |
| Comparative Polymer 2 | 620 | 420 |

Resist Evaluation

Resist solutions were prepared by thoroughly dissolving the silicone polymer (Polymers G to J), photoacid generator (PAG1, PAG2) and dissolution inhibitor (DRI1, DRI2) in 1,000 parts by weight of propylene glycol monomethyl ether acetate (PGMEA) containing 0.01% by weight of surfactant FC-430 (Sumitomo 3M Ltd.) in the combination and amounts shown in Table 2, followed by filtration through a 0.1 μm Teflon filter.

A novolac base resist material OFPR-800 (Tokyo Ouka Kogyo K.K.) was applied onto on a silicon wafer and heat cured at 300° C. for 5 minutes to form a lower layer of 0.5 μm thick. An antireflective material DUV-30 (Brewer Science) was spin coated onto the lower layer and baked at 100° C. for seconds and then at 200° C. for 60 seconds, forming an antireflective film of 55 nm thick.

Each resist solution was spin coated onto the cured DUV-30/novolac resist and baked on a hot plate at 100° C. for 90 seconds to form a resist film of 0.2 μm thick. The resist film was exposed using an KrF excimer laser stepper (Nikon Corporation; NA 0.60), then baked (PEB) at 100° C for 90 seconds, and developed for 30 seconds with a 2.38% aqueous solution of tetramethylammonium hydroxide (TMAH), thereby giving a positive pattern.

The resist pattern was evaluated as follows. The sensitivity of the resist is the optimum dose which provided a 0.20 μm line-and-space pattern in a ratio of 1:1. The resolution is defined as the minimum line width (μm) of the lines and spaces that separated at this dose. The results are shown in Table 2.

TABLE 2

| Polymer (pbw) | Photoacid generator (pbw) | Basic compound (pbw) | Dissolution inhibitor (pbw) | Solvent (pbw) | Sensitivity, mJ/cm² | Resolution, μm |
|---|---|---|---|---|---|---|
| Polymer G (100) | PAG1 (2) | tributylamine (0.1) | — | PGMEA (1000) | 26 | 0.16 |
| Polymer H (100) | PAG1 (2) | tributylamine (0.1) | — | PGMEA (1000) | 20 | 0.17 |
| Polymer I (100) | PAG1 (2) | tributylamine (0.1) | — | PGMEA (1000) | 24 | 0.18 |
| Polymer J (100) | PAG1 (2) | tributylamine (0.1) | — | PGMEA (1000) | 28 | 0.15 |
| Polymer G (100) | PAG2 (2) | tributylamine (0.1) | — | PGMEA (1000) | 16 | 0.18 |
| Polymer G (100) | PAG1 (2) | TMMEA (0.2) | — | PGMEA (1000) | 28 | 0.17 |
| Polymer G (100) | PAG1 (2) | AAA (0.2) | — | PGMEA (1000) | 33 | 0.16 |
| Polymer G (100) | PAG1 (2) | AACN (0.2) | — | PGMEA (1000) | 35 | 0.16 |
| Polymer H (100) | PAG1 (2) | tributylamine (0.1) | DRI1 | PGMEA (1000) | 22 | 0.17 |
| Polymer I (100) | PAG1 (2) | tributylamine (0.1) | DRI2 | PGMEA (1000) | 22 | 0.17 |

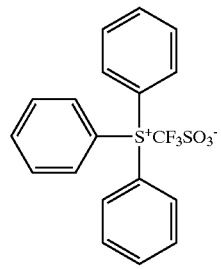

PAG1

PAG2
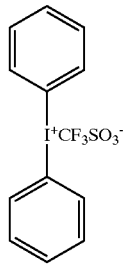

DRI1
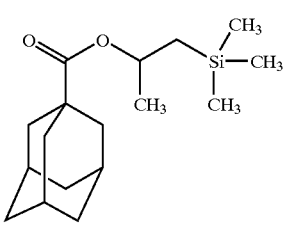

DRI2
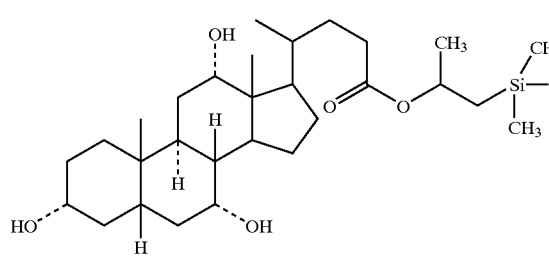

TMMEA
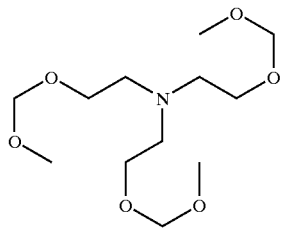

AAA
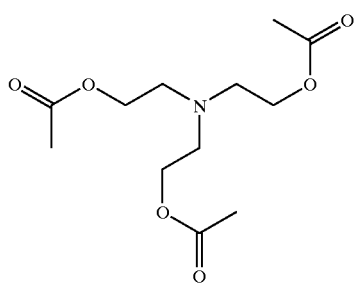

AACN
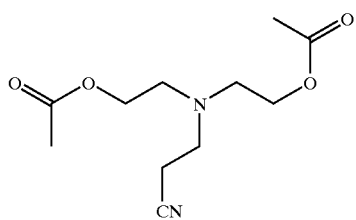

Japanese Patent Application No. 2001-056543 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A silicon-containing polymer comprising recurring units of at least one of the following general formulae (1), (2)-3 and (2)-4:

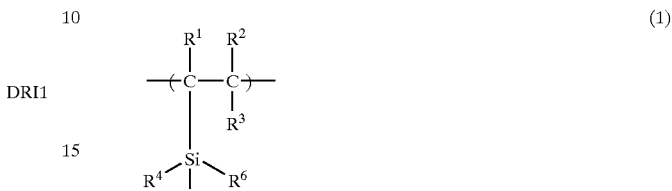 (1)

wherein $R^1$, $R^2$ and $R^3$ each are hydrogen or a straight, branched or cyclic alkyl group of 1 to 10 carbon atoms, $R^4$ and $R^5$ are, each independently of each other, a silicon-containing group attached to the silicon atom through a silalkylene linkage, and $R^6$ is an alkyl or haloalkyl group having 1 to 20 carbon atoms, an aryl group having 6 to 20 carbon atoms or a silicon-containing group attached to the silicon atom through a siloxane or silalkylene linkage,

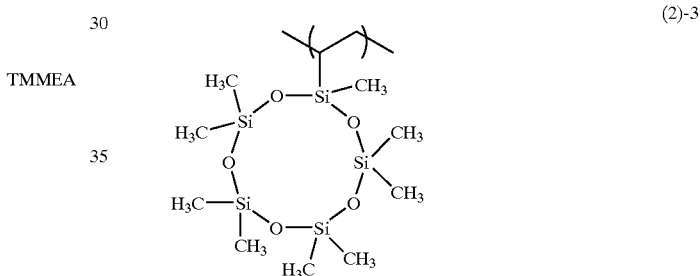 (2)-3

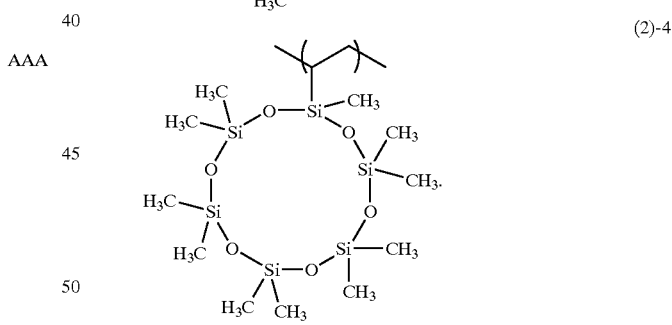 (2)-4

2. The silicon-containing polymer of claim 1, wherein the recurring unit of formula (1) is at least one of formulae (1)-7 and (1)-8

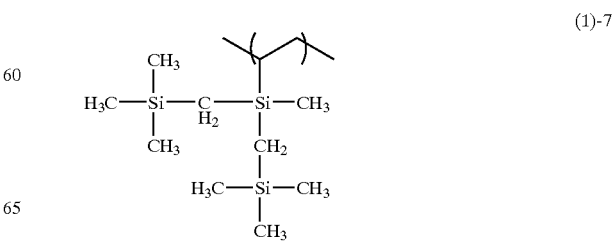 (1)-7

(1)-8

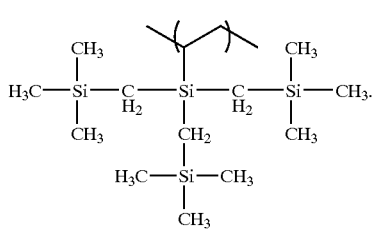

3. A silicon-containing polymer comprising recurring units of at least one of the following general formulae (1) and (2), and further comprising recurring units of general formula (3):

(1)

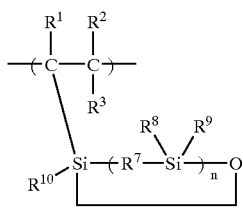

wherein $R^1$, $R^2$ and $R^3$ each are hydrogen or a straight, branched or cyclic alkyl group of 1 to 10 carbon atoms, $R^4$ and $R^5$ are, each independently of each other, a silicon-containing group attached to the silicon atom through a silalkylene linkage, and $R^6$ is an alkyl or haloalkyl group having 1 to 20 carbon atoms, an aryl group having 6 to 20 carbon atoms or a silicon-containing group attached to the silicon atom through a siloxane or silalkylene linkage, (2)

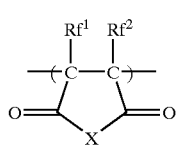

wherein $R^1$ to $R^3$ are as defined above, $R^7$ is an oxygen atom, a straight, branched or cyclic alkylene group of 1 to 10 carbon atoms or an arylene group, $R^8$ to $R^{10}$ each are independently a straight, branched or cyclic alkyl or fluorinated alkyl group having 1 to 10 carbon atoms or an aryl group, and n is an integer of 2 to 10, (3)

wherein X is an oxygen atom, a sulfur atom or —NR—, R is hydrogen, hydroxyl, a straight, branched or cyclic alkyl group of 1 to 10 carbon atoms, or an aryl group, and may contain an acid labile group, $Rf^1$ and $Rf^2$ each are independently hydrogen, fluorine or trifluoromethyl.

4. The silicon-containing polymer of claim 3, wherein the recurring unit of formula (3) is at least one of formulae (3)-1 to (3)-11

(3)-1
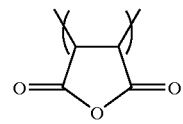

(3)-2
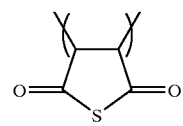

(3)-3

(3)-4
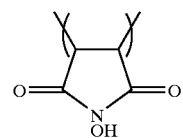

(3)-5
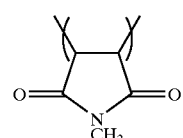

(3)-6
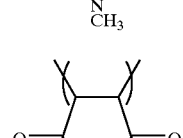

(3)-7
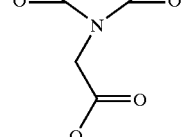

(3)-8
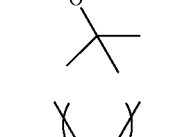

(3)-9
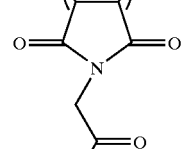

-continued

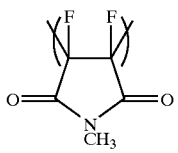
(3)-10

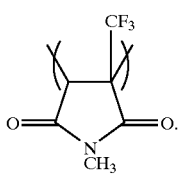
(3)-11

5. A chemically amplified, positive resist composition comprising (A) the polymer of claim 3,
(B) a photoacid generator, and
(C) an organic solvent.

6. A silicon-containing polymer comprising recurring units of at least one of the following general formulae (1) and (2), and further comprising recurring units of general formula (4):

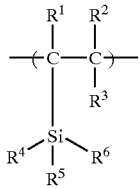
(1)

wherein $R^1$, $R^2$ and $R^3$ each are hydrogen or a straight, branched or cyclic alkyl group of 1 to 10 carbon atoms, $R^4$ is a silicon-containing group attached to the silicon atom through a silalkylene linkage, $R^5$ and $R^6$ each are independently an alkyl or haloalkyl group having 1 to 20 carbon atoms, an aryl group having 6 to 20 carbon atoms or a silicon-containing group attached to the silicon atom through a siloxane or silalkylene linkage,

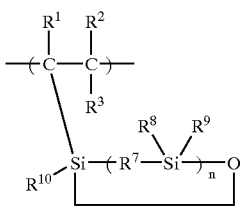
(2)

wherein $R^1$ to $R^3$ are as defined above, $R^7$ is an oxygen atom, a straight, branched or cyclic alkylene group of 1 to 10 carbon atoms or an arylene group, $R^8$ to $R^{10}$ each are independently a straight, branched or cyclic alkyl or fluorinated alkyl group having 1 to 10 carbon atoms or an aryl group, and n is an integer of 4 to 10,

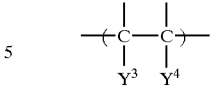
(4)

wherein $Y^1$, $Y^2$, $Y^3$ and $Y^4$ are independently selected from the class consisting of hydrogen, fluorine, chlorine, bromine, cyano, alkoxycarbonyl, fluorinated alkyl and fluorinated alkoxycarbonyl groups.

7. A silicon-containing polymer according to claim 6, wherein the compound of formula (2) is of formula (2)-3 or (2)-4

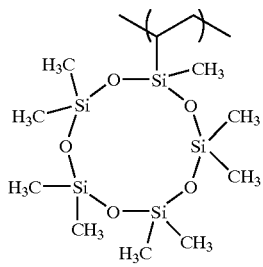
(2)-3

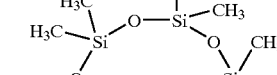
(2)-4

8. A silicon-containing polymer comprising recurring units of at least one of the following general formulae (1) and (2), and further comprising recurring units of general formula (5):

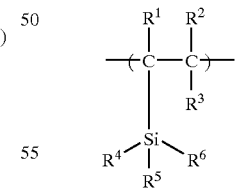
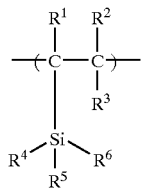
(1)

wherein $R^1$, $R^2$ and $R^3$ each are hydrogen or a straight, branched or cyclic alkyl group of 1 to 10 carbon atoms, $R^4$ is a silicon-containing group attached to the silicon atom through a silalkylene linkage, $R^5$ and $R^6$ each are independently an alkyl or haloalkyl group having 1 to 20 carbon atoms, an aryl group having 6 to 20 carbon atoms or a silicon-containing group attached to the silicon atom through a siloxane or silalkylene linkage,

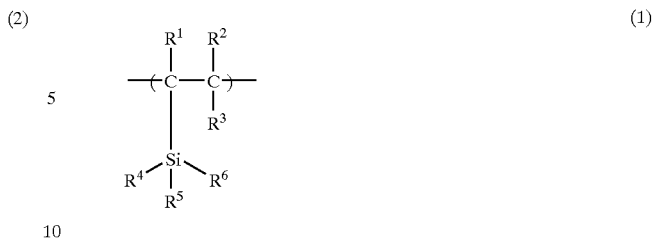

(1)

wherein $R^1$, $R^2$ and $R^3$ each are hydrogen or a straight, branched or cyclic alkyl group of 1 to 10 carbon atoms, $R^4$ and $R^5$ are, each independently of each other, a silicon-containing group attached to the silicon atom through a silalkylene linkage, and $R^6$ is an alkyl or haloalkyl group having 1 to 20 carbon atoms, an aryl group having 6 to 20 carbon atoms or a silicon-containing group attached to the silicon atom through a siloxane or silalkylene linkage,

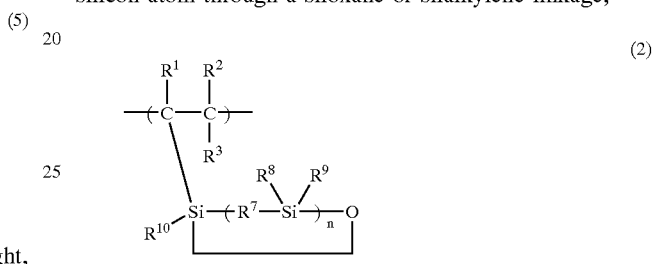

(2)

wherein $R^1$ to $R^3$ are as defined above, $R^7$ is an oxygen atom, a straight, branched or cyclic alkylene group of 1 to 10 carbon atoms or an arylene group, $R^8$ to $R^{10}$ each are independently a straight, branched or cyclic alkyl or fluorinated alkyl group having 1 to 10 carbon atoms or an aryl group, and n is an integer of 4 to 10.

12. A process for forming a resist pattern comprising the steps of:

applying the resist composition of claim 11 onto a substrate to form a resist layer, heat treating the resist layer and then exposing it to high-energy radiation having a wavelength of up to 300 nm or electron beam through a photo mask, and optionally heat treating the exposed resist layer and developing it with a developer.

13. A process for forming a resist pattern comprising the steps of:

applying the resist composition of claim 11 onto a processable substrate formed on a support substrate through an organic film to form a resist layer, heat treating the resist layer and then exposing it to high-energy radiation having a wavelength of up to 300 nm or electron beam through a photo mask, optionally heat treating the exposed resist layer and developing it with a developer, and treating the organic film and the processable substrate by an etching process including oxygen plasma etching at the portions where the exposed resist layer portions are removed by developing.

14. The process of claim 13 wherein the organic film is a novolac resin or polyhydroxystyrene layer.

15. A process for forming a resist pattern comprising the steps of:

applying the resist composition of claim 11 onto a processable substrate formed on a support substrate to form a resist layer,

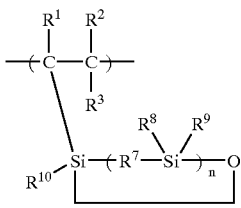

(2)

wherein $R^1$ to $R^3$ are as defined above, $R^7$ is an oxygen atom, a straight, branched or cyclic alkylene group of 1 to 10 carbon atoms or an arylene group, $R^8$ to $R^{10}$ each are independently a straight, branched or cyclic alkyl or fluorinated alkyl group having 1 to 10 carbon atoms or an aryl group, and n is an integer of 4 to 10,

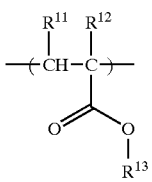

(5)

wherein $R^{11}$ and $R^{12}$ each are hydrogen or a straight, branched or cyclic alkyl group of 1 to 10 carbon atoms, and $R^{13}$ is an acid labile group or adhesive group.

9. A chemically amplified, positive resist composition comprising (A) the polymer of claim 8, (B) a photoacid generator, and (C) an organic solvent.

10. A silicon-containing polymer according to claim 8, wherein the compound of formula (2) is of formula (2)-3 or (2)-4

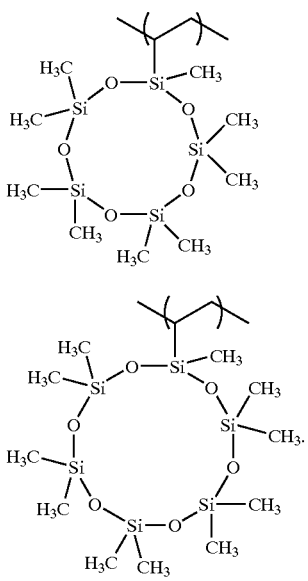

11. A resist composition comprising a silicon-containing polymer comprising recurring units of at least one of the following general formulae (1) and (2):

heat treating the resist layer and then exposing it to high-energy radiation having a wavelength of up to 300 nm or electron beam through a photo mask, optionally heat treating the exposed resist layer and developing it with a developer, and treating the processable substrate by an etching with a halogen gas containing chlorine or bromine at the portions where the exposed resist layer portions are removed by developing.

16. A silicon-containing polymer according to claim 11 wherein the compound of formula (2) is of formula (2)-3 or (2)-4

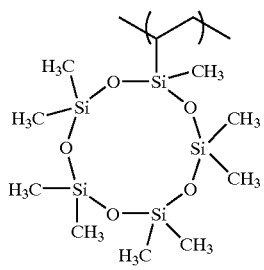

(2)-3

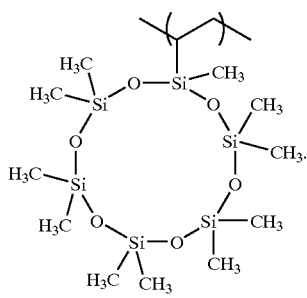

(2)-4

17. A chemically amplified, positive resist composition comprising (A) a silicon-containing polymer comprising recurring units of at least one of the following general formulae (1) and (2):

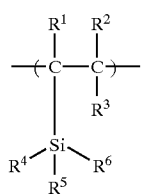

(1)

wherein $R^1$, $R^2$ and $R^3$ each are hydrogen or a straight, branched or cyclic alkyl group of 1 to 10 carbon atoms, $R^4$ and $R^5$ are, each independently of each other, a silicon-containing group attached to the silicon atom through a silalkylene linkage, and $R^6$ is an alkyl or haloalkyl group having 1 to 20 carbon atoms, an aryl group having 6 to 20 carbon atoms or a silicon-containing group attached to the silicon atom through a siloxane or silalkylene linkage,

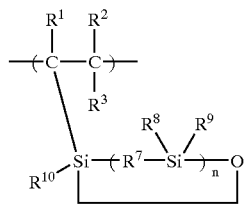

(2)

wherein $R^1$ to $R^3$ are as defined above, $R^7$ is an oxygen atom, a straight, branched or cyclic alkylene group of 1 to 10 carbon atoms or an arylene group, $R^8$ to $R^{10}$ each are independently a straight, branched or cyclic alkyl or fluorinated alkyl group having 1 to 10 carbon atoms or an aryl group, and n is an integer of 2 to 10, (B) a photoacid generator, and (C) an organic solvent.

18. The resist composition of claim 17 further comprising (D) a dissolution inhibitor.

19. A process for forming a resist pattern comprising the steps of:

applying the resist composition of claim 18 onto a substrate to form a resist layer, heat treating the resist layer and then exposing it to high-energy radiation having a wavelength of up to 300 nm or electron beam through a photo mask, and optionally heat treating the exposed resist layer and developing it with a developer.

20. A process for forming a resist pattern comprising the steps of:

applying the resist composition of claim 18 onto a processable substrate formed on a support substrate through an organic film to form a resist layer, heat treating the resist layer and then exposing it to high-energy radiation having a wavelength of up to 300 nm or electron beam through a photo mask, optionally heat treating the exposed resist layer and developing it with a developer, and treating the organic film and the processable substrate by an etching process including oxygen plasma etching at the portions where the exposed resist layer portions are removed by developing.

21. A process for forming a resist pattern comprising the steps of:

applying the resist composition of claim 18 onto a processable substrate formed on a support substrate to form a resist layer, heat treating the resist layer and then exposing it to high-energy radiation having a wavelength of up to 300 nm or electron beam through a photo mask, optionally heat treating the exposed resist layer and developing it with a developer, and treating the processable substrate by an etching with a halogen gas containing chlorine or bromine at the portions where the exposed resist layer portions are removed by developing.

22. The resist composition of claim 17 further comprising (E) a basic compound.

23. A process for forming a resist pattern comprising the steps of:
applying the resist composition of claim 22 onto a substrate to form a resist layer,
heat treating the resist layer and then exposing it to high-energy radiation having a wavelength of up to 300 nm or electron beam through a photo mask, and
optionally heat treating the exposed resist layer and developing it with a developer.

24. A process for forming a resist pattern comprising the steps of:
applying the resist composition of claim 22 onto a processable substrate formed on a support substrate through an organic film to form a resist layer,
heat treating the resist layer and then exposing it to high-energy radiation having a wavelength of up to 300 nm or electron beam through a photo mask,
optionally heat treating the exposed resist layer and developing it with a developer, and
treating the organic film and the processable substrate by an etching process including oxygen plasma etching at the portions where the exposed resist layer portions are removed by developing.

25. A process for forming a resist pattern comprising the steps of:
applying the resist composition of claim 22 onto a processable substrate formed on a support substrate to form a resist layer,
heat treating the resist layer and then exposing it to high-energy radiation having a wavelength of up to 300 nm or electron beam through a photo mask,
optionally heat treating the exposed resist layer and developing it with a developer, and
treating the processable substrate by an etching with a halogen gas containing chlorine or bromine at the portions where the exposed resist layer portions are removed by developing.

26. A process for forming a resist pattern comprising the steps of:
applying the resist composition of claim 17 onto a substrate to form a resist layer,
heat treating the resist layer and then exposing it to high-energy radiation having a wavelength of up to 300 nm or electron beam through a photo mask, and
optionally heat treating the exposed resist layer and developing it with a developer.

27. A process for forming a resist pattern comprising the steps of:
applying the resist composition of claim 17 onto a processable substrate formed on a support substrate through an organic film to form a resist layer,
heat treating the resist layer and then exposing it to high-energy radiation having a wavelength of up to 300 nm or electron beam through a photo mask,
optionally heat treating the exposed resist layer and developing it with a developer, and
treating the organic film and the processable substrate by an etching process including oxygen plasma etching at the portions where the exposed resist layer portions are removed by developing.

28. A process for forming a resist pattern comprising the steps of:
applying the resist composition of claim 17 onto a processable substrate formed on a support substrate to form a resist layer,
heat treating the resist layer and then exposing it to high-energy radiation having a wavelength of up to 300 nm or electron beam through a photo mask,
optionally heat treating the exposed resist layer and developing it with a developer, and
treating the processable substrate by an etching with a halogen gas containing chlorine or bromine at the portions where the exposed resist layer portions are removed by developing.

29. A silicon-containing polymer comprising recurring units of at least one of the following general formulae (1), and (2) and at least one of formulae (4)-1 to (4)-10

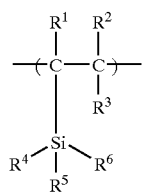
(1)

wherein $R^1$, $R^2$ and $R^3$ each are hydrogen or a straight, branched or cyclic alkyl group of 1 to 10 carbon atoms, $R^4$ is a silicon-containing group attached to the silicon atom through a silalkylene linkage, $R^5$ and $R^6$ each are independently an alkyl or haloalkyl group having 1 to 20 carbon atoms, an aryl group having 6 to 20 carbon atoms or a silicon-containing group attached to the silicon atom through a siloxane or silalkylene linkage.

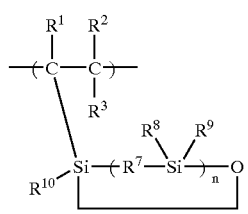
(2)

wherein $R^1$ to $R^3$ are as defined above, $R^7$ is an oxygen atom a straight, branched or cyclic alkylene group of 1 to 10 carbon atoms or an arylene group, $R^8$ to $R^{10}$ each are independently a straight branched or cyclic alkyl or fluorinated alkyl group having 1 to 10 carbon atoms or an aryl group, and n is an integer of 2 to 10,

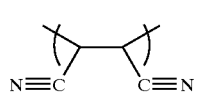
(4)-1

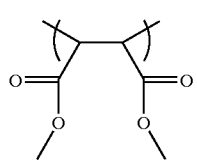
(4)-2

-continued (4)-3 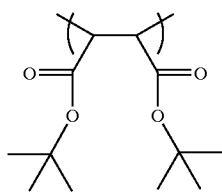

(4)-4 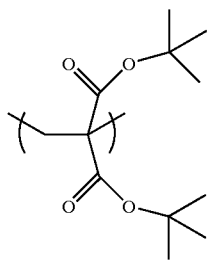

(4)-5 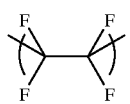

(4)-6 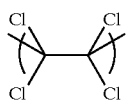

(4)-7 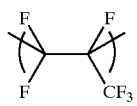

(4)-8 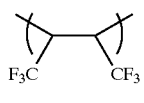

(4)-9 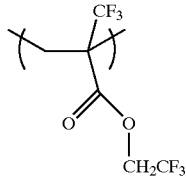

(4)-10 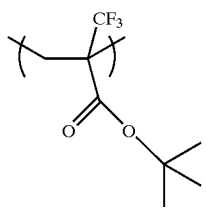

30. A silicon containing polymer selected from the group consisting of polymers C, E, F, H and I, each polymer consisting of monomers drawn Polymer-C

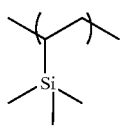 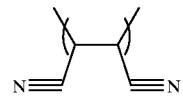

Polymer-E

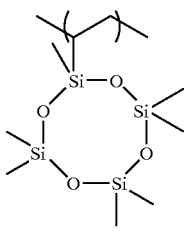 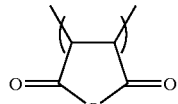

Polymer-F

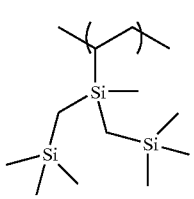 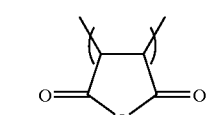

Polymer-H

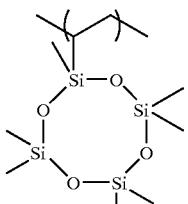 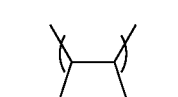

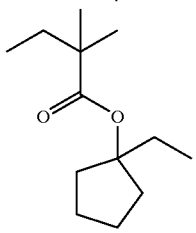 

Polymer-I

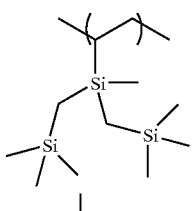 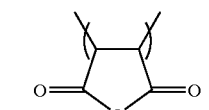

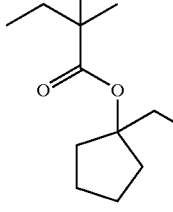 

31. A chemically amplified, positive resist composition comprising (A) the polymer of claim 30,
(B) a photoacid generator, and
(C) an organic solvent.

32. A chemically amplified, positive resist composition comprising (A) a silicon-containing polymer comprising recurring units of at least one of the following general formulae (1), (2) and (4):

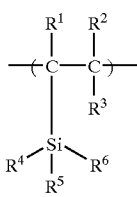

(1)

wherein $R^1$, $R^2$ and $R^3$ each are hydrogen or a straight, branched or cyclic alkyl group of 1 to 10 carbon atoms, $R^4$ is a silicon-containing group attached to the silicon atom through a silalkylene linkage, $R^5$ and $R^6$ each are independently an alkyl or haloalkyl group having 1 to 20 carbon atoms, an aryl group having 6 to 20 carbon atoms or a silicon-containing group attached to the silicon atom through a siloxane or silalkylene linkage,

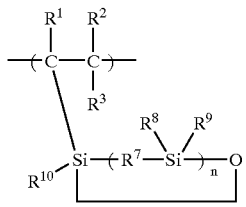

(2)

wherein $R^1$ to $R^3$ are as defined above, $R^7$ is an oxygen atom, a straight, branched or cyclic alkylene group of 1 to 10 carbon atoms or an arylene group, $R^8$ to $R^{10}$ each are independently a straight, branched or cyclic alkyl or fluorinated alkyl group having 1 to 10 carbon atoms or an aryl group, and n is an integer of 2 to 10,

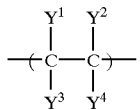

(4)

wherein $Y^1$, $Y^2$, $Y^3$ and $Y^4$ are independently selected from the class consisting of hydrogen, fluorine, chlorine, bromine, cyano, alkoxycarbonyl, fluorinated alkyl and fluorinated alkoxycarbonyl groups, (B) a photoacid generator, and
(C) an organic solvent.

33. A silicon-containing polymer comprising recurring units of formula (1):

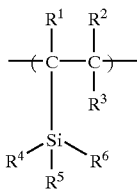

(1)

wherein $R^1$, $R^2$ and $R^3$ each are hydrogen or a straight, branched or cyclic alkyl group of 1 to 10 carbon atoms, $R^6$ is an alkyl or haloalkyl group having 1 to 20 carbon atoms, an aryl group having 6 to 20 carbon atoms or a silicon-containing group attached to the silicon atom through a siloxane or silalkylene linkage, R4 and $R^5$ are each independently, a silicon-containing group attached to the silicon atom through a silalkylene linkage of the following formula

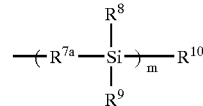

wherein $R^7$ is a straight, branched or cyclic alkylene group of 1 to 10 carbon atoms or an arylene group, $R^8$ to $R^{10}$ each are independently a straight, branched or cyclic alkyl or fluorinated alkyl group having 1 to 10 carbon atoms or an aryl group, m is an integer of 1 to 10.

34. A chemically amplified, positive resist composition comprising
(A) the polymer of claim 33,
(B) a photoacid generator, and
(C) an organic solvent.

35. A process for forming a resist pattern comprising the steps of:
applying the resist composition of claim 34 onto a substrate to form a resist layer,
heat treating the resist layer and then exposing it to high-energy radiation having a wavelength of up to 300 nm or electron beam through a photo mask, and
optionally heat treating the exposed resist layer and developing it with a developer.

36. A process for forming a resist pattern comprising the steps of:
applying the resist composition of claim 34 onto a processable substrate formed on a support substrate through an organic film to form a resist layer,
heat treating the resist layer and then exposing it to high-energy radiation having a wavelength of up to 300 nm or electron beam through a photo mask,
optionally heat treating the exposed resist layer and developing it with a developer, and
treating the organic film and the processable substrate by an etching process including oxygen plasma etching at the portions where the exposed resist layer portions are removed by developing.

37. A process for forming a resist pattern comprising the steps of:
applying the resist composition of claim 34 onto a processable substrate formed on a support substrate to form a resist layer,
heat treating the resist layer and then exposing it to high-energy radiation having a wavelength of up to 300 nm or electron beam through a photo mask,
optionally heat treating the exposed resist layer and developing it with a developer, and
treating the processable substrate by an etching with a halogen gas containing chlorine or bromine at the portions where the exposed resist layer portions are removed by developing.

* * * * *